(12) United States Patent
Ausserlechner

(10) Patent No.: US 11,550,004 B2
(45) Date of Patent: Jan. 10, 2023

(54) SIGNAL COMPENSTATION SYSTEM CONFIGURED TO MEASURE AND COUNTERACT ASYMMETRY IN HALL SENSORS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 366 days.

(21) Appl. No.: 16/394,304

(22) Filed: Apr. 25, 2019

(65) Prior Publication Data

US 2020/0341078 A1 Oct. 29, 2020

(51) Int. Cl.
*G01R 33/07* (2006.01)
*H01L 43/04* (2006.01)
*H01L 43/06* (2006.01)
*G01R 33/00* (2006.01)

(52) U.S. Cl.
CPC ....... *G01R 33/077* (2013.01); *G01R 33/0017* (2013.01); *H01L 43/04* (2013.01); *H01L 43/065* (2013.01)

(58) Field of Classification Search
CPC .... G01R 33/07; G01R 33/072; G01R 33/075; G01R 33/077; G01R 33/0017; G01R 33/0023; G01R 33/0029; G01R 33/0035; G01R 33/0052; H01L 3/04; H01L 3/06; H01L 3/065
See application file for complete search history.

(56) References Cited

U.S. PATENT DOCUMENTS

| 2013/0214775 A1* | 8/2013 | Ausserlechner | ...... H01L 43/065 324/251 |
| 2014/0084911 A1* | 3/2014 | Ausserlechner | ....... G01R 33/07 324/251 |
| 2020/0225297 A1* | 7/2020 | Ausserlechner | ... G01R 33/0023 |

OTHER PUBLICATIONS

Beran, Philip, et al., "Impact of Contact Misalignment on Magnetic Cross Sensitivity of Integrated Vertical Hall Sensors". IEEE Transactions on Magnetics, vol. 55, Issue 1, (2019), pp. 1-4.

* cited by examiner

*Primary Examiner* — David M Schindler
(74) *Attorney, Agent, or Firm* — Harrity & Harrity, LLP

(57) ABSTRACT

A sensor cross-talk compensation system includes a semiconductor substrate having a first main surface and a second main surface opposite to the first main surface; a vertical Hall sensor element disposed in the semiconductor substrate, the vertical Hall sensor element is configured to generate a sensor signal in response to a magnetic field impinging thereon; and an asymmetry detector configured to detect an asymmetric characteristic of the vertical Hall sensor element. The asymmetry detector includes a detector main region that vertically extends into the semiconductor substrate from the first main surface towards the second main surface and is of a conductivity type having a first doping concentration; and at least three detector contacts disposed in the detector main region at the first main surface, the at least three detector contacts are ohmic contacts of the conductivity type having a second doping concentration that is higher than the first doping concentration.

21 Claims, 9 Drawing Sheets

SIGNAL COMPENSTATION SYSTEM CONFIGURED TO MEASURE AND COUNTERACT ASYMMETRY IN HALL SENSORS

FIELD

The present disclosure relates generally to devices, systems, and methods related to measuring and counteracting asymmetry in Hall sensors, and methods of manufacturing the same.

BACKGROUND

Asymmetries in semiconductor devices, such as Hall effect devices, may be introduced in the manufacturing process due to, for example, a misalignment of masks, anisotropic growth or etching of layers, anisotropic out-diffusion or implantation (e.g., oblique implantation angles), inhomogeneous doping or mechanical stress. Also, inhomogeneous temperature during operation of the device may result to asymmetric properties.

The consequence of asymmetries of Hall effect devices is primarily a resultant change in the sensitive direction of the magnetic field. For example, suppose a vertical Hall effect device with a current flow parallel to the (x,z)-plane of a Cartesian reference system. In the absence of asymmetries, the vertical Hall effect device would respond to a y-component (By) of a magnetic field (as long as the field is reasonably small and no mechanical stress acts on the device)—and it would not respond to an x-component (Bx) and a z-component (Bz) of the magnetic field. That is, the vertical Hall effect device would be responsive to or have a sensitivity axis aligned with the y-direction and not to the x- and z-directions. However, small asymmetries in the device lead to a small sensitivity to the Bx and/or the Bz magnetic field components, too. This is called magnetic cross-talk, and in general it should be avoided for accurate sensor systems.

Therefore, an improved device capable of detecting and/or compensating for magnetic cross-talk may be desirable.

SUMMARY

Embodiments provide devices, systems, and methods related to measuring and counteracting asymmetry in Hall sensors.

One or more embodiments provide a sensor cross-talk compensation system including a semiconductor substrate that has a first main surface and a second main surface opposite to the first main surface; a vertical Hall sensor element disposed in the semiconductor substrate, wherein the vertical Hall sensor element is configured to generate a first sensor signal in response to a first magnetic field impinging thereon; and an asymmetry detector configured to detect an asymmetric characteristic of the vertical Hall sensor element. The asymmetry detector includes a detector main region that vertically extends into the semiconductor substrate from the first main surface towards the second main surface and is of a conductivity type having a first doping concentration; and at least three detector contacts disposed in the detector main region at the first main surface, wherein the at least three detector contacts are ohmic contacts of the conductivity type having a second doping concentration that is higher than the first doping concentration. The sensor cross-talk compensation system further includes a cross-talk compensation circuit that includes a resistance ratio measurement circuit configured to determine a ratio between a first resistance and a second resistance, wherein the first resistance is a resistance between a first pair of detector contacts of the at least three detector contacts and the second resistance is a resistance between a second pair of detector contacts of the at least three detector contacts; and signal processing circuitry configured to generate a compensated measurement signal based on the first sensor signal and the determined ratio.

One or more embodiments provide a method of performing sensor cross-talk compensation, the method includes generating a first sensor signal by a vertical Hall sensor element responsive to a first magnetic field aligned in a first direction, the first direction being in-plane to a main surface of a substrate comprising the vertical Hall sensor element; generating a second sensor signal by a lateral Hall sensor element responsive to a second magnetic field aligned in a second direction orthogonal to the first direction and out-of-plane to the main surface of the substrate; determining a ratio between a first resistance and a second resistance, where the first resistance is a resistance between a first pair of detector contacts of an asymmetry detector and the second resistance is a resistance between a second pair of detector contacts of the asymmetry detector, where at least one contact of the second pair of detector contacts is different from the first pair of detector contacts; and generating a compensated measurement signal based on the first sensor signal, the second sensor signal, and the determined ratio.

One or more embodiments provide a method of manufacturing a sensor chip. The method of manufacturing includes providing a semiconductor substrate and having a first main surface and a second main surface opposite to the first main surface; forming a sensor main region of a vertical Hall sensor element in the semiconductor substrate, wherein the sensor main region vertically extends into the semiconductor substrate from the first main surface towards the second main surface and is of a conductivity type, and wherein the vertical Hall sensor element is configured to generate a first sensor signal in response to a first magnetic field impinging thereon from a first direction; forming a plurality of sensor contacts in the sensor main region, wherein the plurality of sensor contacts are of the conductivity type; forming a detector main region of an asymmetry detector in the semiconductor substrate, wherein the detector main region vertically extends into the semiconductor substrate from the first main surface towards the second main surface and is of the conductivity type having a first doping concentration, where the detector main region includes a first peripheral edge and a second peripheral edge oppositely arranged from the first peripheral edge in the first direction, and wherein the asymmetry detector is configured to detect an asymmetric characteristic of the vertical Hall sensor element; and forming at least three detector contacts in the detector main region, wherein the at least three detector contacts are ohmic contacts of the conductivity type having a second doping concentration that is higher than the first doping concentration. A first pair of detector contacts of the at least three detector contacts have a first resistance therebetween. A second pair of detector contacts of the at least three detector contacts have a second resistance therebetween. A first detector contact of the first pair of detector contacts is arranged from the first peripheral edge by a first distance, and a first detector contact of the second pair of detector contacts is arranged from the second peripheral edge by a second distance. The first resistance and the second resistance are equal on a condition that the first distance and the second distance are equal, the first resistance is greater than the second resistance on a condition that the first distance is less than the second distance, and the first resistance is less than the second resistance on a condition that the first distance is greater than the second distance.

One or more embodiments further provide a sensor chip manufactured by the method of manufacturing.

BRIEF DESCRIPTION OF THE DRAWINGS

Embodiments are described herein making reference to the appended drawings.

DETAILED DESCRIPTION

Figure 1A:
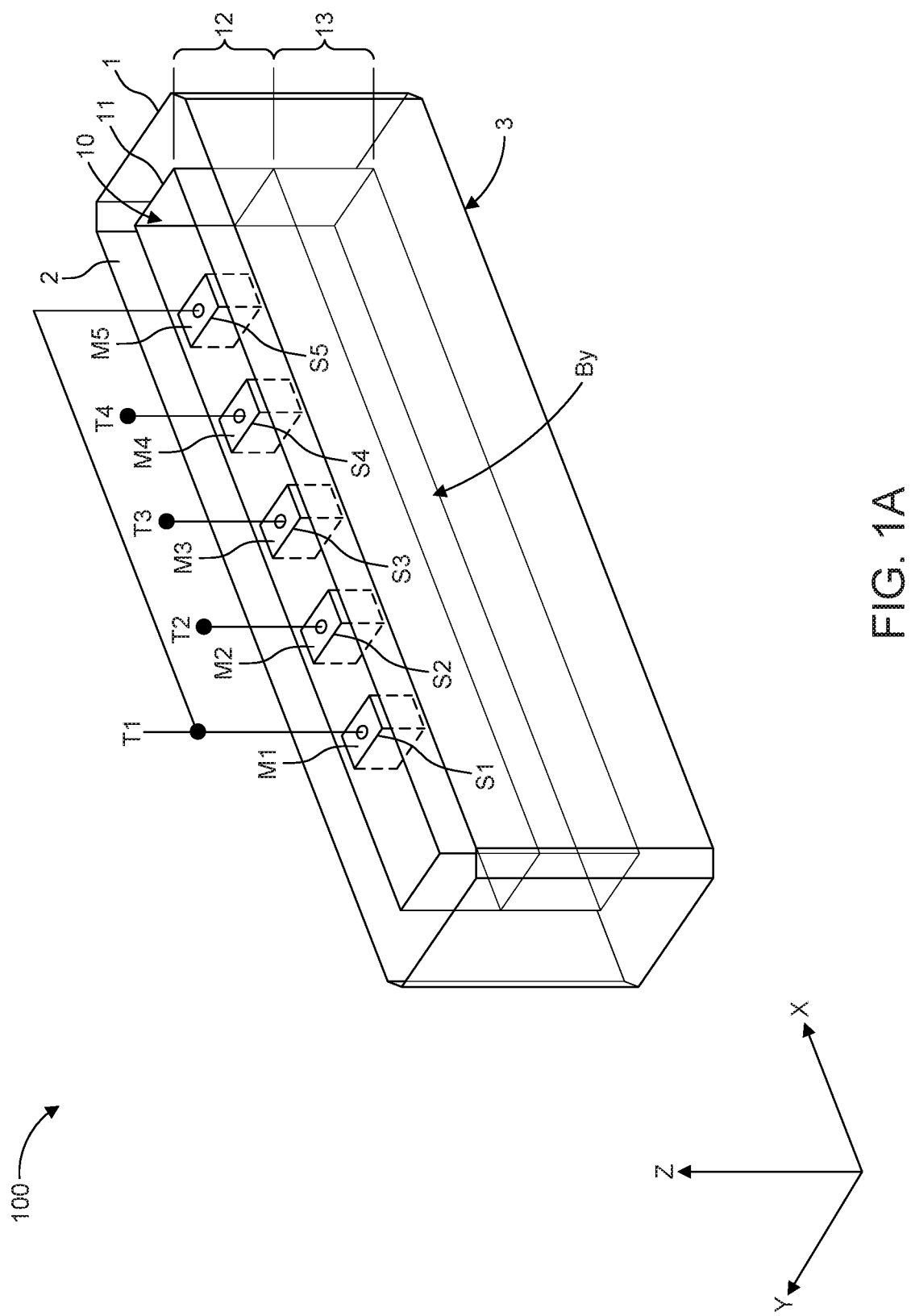
FIG. 1A illustrates a perspective view of a Hall effect device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

The Figures illustrate relative doping concentrations by indicating "−" or "+" next to the doping type "n" or "p". For example, "n-" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

In this specification, embodiments are illustrated including p-doped semiconductor regions and n-doped semiconductor regions. Alternatively, the semiconductor devices can be formed with opposite doping relations so that the illustrated p-doped regions are n-doped and the illustrated n-doped regions are p-doped.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. However, the semiconductor need not be silicon-based.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, W, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, Chemical Vapor Deposition (CVD), physical vapor deposition (PVD), evaporation, hybrid physical-chemical vapor deposition (HPCVD), etc.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may be used interchangeably throughout this description.

Magnetic sensors include Hall-effect sensors (Hall sensors), for example. A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby, a Hall plate can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used for proximity switching, positioning, speed detection, and current sensing applications.

In some examples, Hall sensor elements may be implemented as vertical Hall sensor elements. A vertical Hall sensor is a magnetic field sensor which is sensitive to a magnetic field component which extends parallel to their surface. This means they are sensitive to magnetic fields parallel, or in-plane, to the integrated circuit (IC) surface (i.e., the main surface of the chip substrate). The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

Some Hall sensor elements may also be implemented as lateral Hall sensor elements. A lateral Hall sensor is sensitive to a magnetic field component perpendicular to their surface. This means they are sensitive to magnetic fields vertical, or out-of-plane, to the IC surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

According to one or more embodiments, a magnetic field sensor and a sensor circuit may be both accommodated (i.e., integrated) in the same chip package (e.g., a plastic encapsulated package, such as leaded package or leadless package, or a surface mounted device (SMD)-package). This chip package may also be referred to as sensor package.

The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and/or any other processes required to make a sensor output suitable for processing after conditioning.

For example, signal conditioning may further include signal calibration and cross-talk compensation. Signal calibration and cross-talk compensation may be performed by a processing circuit that executes computer code, which when executed by the processing circuit causes the processing circuit to perform at least part of the signal calibration and cross-talk compensation. Furthermore, signal calibration and cross-talk compensation may be performed in the digital domain of a mixed-signal circuit. Furthermore, signal calibration and cross-talk compensation may be performed by analog circuitry, or by a processing circuit that implements operations equivalent to the aforementioned hardware by way of executing computer code stored on a non-transitory computer readable storage medium.

Thus, the sensor circuit may include analog circuitry and/or digital circuitry including an analog-to-digital converter (ADC) that converts the analog signal from the one or more sensor elements to a digital signal. The sensor circuit may include a digital signal processor (DSP) that performs some processing on the digital signal. Therefore, the sensor package may include a circuit that conditions and amplifies the small signal of the magnetic field sensor element via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, one or more sensors and the sensor circuit are disposed on either the same semiconductor die or on multiple dies in the same package. For example, a sensor might be on one die and the sensor circuit may be on another die such that the two dies are electrically connected to each other within the package. In this case, the dies may be comprised of the same or different semiconductor materials, such as GaAs and Si, or the sensor might be sputtered to a ceramic or glass platelet, which is not a semiconductor.

Embodiments relate to electronic devices, referred to as asymmetry detectors, that are manufactured together with one or more vertical Hall-devices (e.g., in a same manufacturing step, such as a doping step), and which provide electrically measurable quantities that are indicative of the degree of asymmetry in a Hall effect device. Specifically, an asymmetry detector is configured to detect an asymmetric characteristic of a vertical Hall sensor element, the asymmetric characteristic being a tilt of current flow lines in the vertical Hall sensor element (with or without a magnetic field present). The tilt is zero when the current flow lines are orthogonal to a main surface (i.e., upper surface) of a semiconductor substrate.

One or more embodiments relate to operating these so-called asymmetry detectors. Furthermore, one or more embodiments relate to reducing magnetic cross-talk in a sensing system that includes at least one Hall effect device and at least one asymmetry detector via magnetic cross-talk compensation applied to a sensor signal to generate at least one compensated measurement signal.

Figure 1B:
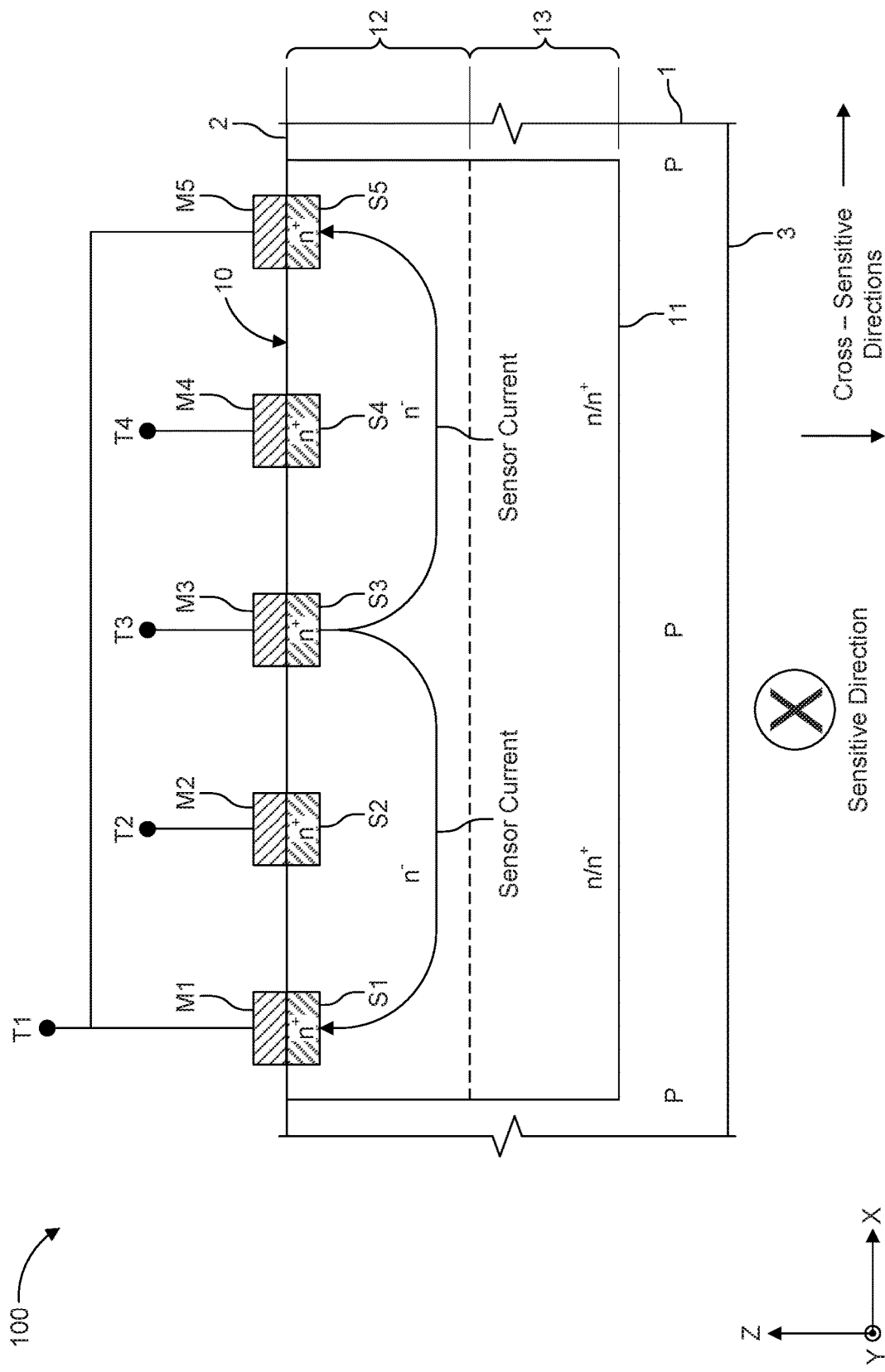
FIG. 1B illustrates a cross-section view of the Hall effect device illustrated in FIG. 1A.

FIG. 1A illustrates a perspective view of a Hall effect device 100 according to one or more embodiments. Furthermore, FIG. 1B illustrates a cross-section view of the Hall effect device 100 illustrated in FIG. 1A.

The Hall effect device 100 includes a semiconductor substrate 1 having a first conductivity type (e.g., p-doping) and includes a first (frontside) surface 2 and a second (backside) surface 3. The semiconductor substrate 1 may be referred to as a common substrate that is common to one or more Hall sensors. Hall effect device 100 further includes a vertical Hall sensor element 10 that comprises a plurality of ohmic contacts S1-S5, hereinafter referred to as sensor contacts. In particular, the vertical Hall sensor element 10 includes a doped well region 11 (i.e., a sensor main region) having a second conductivity type with a low or a moderate doping concentration that vertically extends from the first surface 2 into the substrate 1 towards the second surface 3, although not complete to the second surface 3. Thus, the doped well region 11 and the substrate 1 may share a common first surface 2. The doped well region 11 includes a Hall effect region 12 and may further include a buried layer 13. Like Hall effect region 12, the buried layer 13 is of the second conductivity type, but has a moderate or high doping, and typically has a higher doping concentration than the Hall effect region 12.

In some embodiments, a p-doped cap layer (not illustrated) may be provided above the Hall effect region 12 to reduce noise. In this case, the top of the p-doped cap is flush with the top surface of the substrate 1.

In an alternative arrangement, the substrate 1 may have the same conductivity type as the doped well region 11. For example, the substrate 1 may have an n-doping. In this case, p-tubs having a p-doping between the Hall devices and the substrate maybe used to isolate Hall devices from each other, or a trench isolation with non-conducting isolating layers, such as nitrides, may be used to isolate the Hall devices from each other.

The sensor contacts S1-S5 are discrete, highly doped regions (e.g., n+ doped regions) that are arranged at the first surface 2. In particular, these are shallow n+S/D-tubs (highly n-doped source-drain tubs). In one example, the contacts may be about 200 nm to 1.2 um deep, whereas the substrate 1 may be about 750 um thick. In another example, the contacts may be disposed onto the first surface 2 without extending into the substrate 1. The contacts are ohmic contacts—in contrast to Schottky contacts or other types. As used herein, the term "ohmic contact" means that current changes its direction but not its magnitude when voltage across the contact is reversed.

In this example, the sensor contacts S1-S5 extend from the first surface 2 partially into the doped well region 11, and have a higher doping concentration than the surrounding doped well region 11. In addition, the sensor contacts S1-S5 are linearly arranged with respect to each other in a direction that is orthogonal to the main sensitive direction (i.e., the sensing axis) of the sensor element 10. In this example, the sensor contacts S1-S5 are linearly arranged in the x-direction, in-plane to the first surface 2 of the substrate 1. While the sensor contacts have an elongated shape that extends in the y-direction, the shape thereof is not limited to a particular shape. For example, square sensor contacts may be used. Thus, the main sensitive direction is aligned with the y-axis, in-plane to the first surface 2, and the sensor element 10 is sensitive to By magnetic fields. Accordingly, in FIG. 1B, the main sensitive direction is perpendicular to the figure plane, the cross-sensitive directions are parallel to the figure plane.

Each sensor contact S1-S5 is electrically coupled to a respective terminal T1-T4. In this example, sensor contacts S1 and S5 are shorted together. A current is applied to the outer contacts (i.e., S1 and S5) and the middle contact (i.e., S3), resulting in charge carrier flow. For example, the current may be injected into sensor contact S3 and extracted from sensor contacts S1 and S5. The magnetic field By induces a force on the charge carrier flow, leading to a Hall voltage, which can be measured at the contacts in between (i.e., at sensor contacts S2 and S4). Thus, terminals T2 and T4 are used to read out the Hall voltage as a sensor signal.

Metal contacts M1-M5 or conductive plugs may each be disposed on the first surface 3 and arranged in contact with a respective sensor contact S1-S5 to provide an electrical contact to a respective terminal T1-T5.

Ideally, the sensor contacts S1-S5 are symmetrically arranged in the doped well region 11 according to its sensitive direction. In this example, the sensitive direction is assumed to be the y-direction and the cross-sensitive direction is assumed to be in the z-direction. Thus, the sensor contacts S1-S5 should be centered in the doped well region 11 with respect to the y-direction so that the short-sides of the sensor contacts, oppositely situated from each other, are equally spaced from the long edges of the doped well region 11. For symmetric sensor contacts S1-S5, the current streamlines are mirrored symmetrically to the center symmetry plane of the doped well region 11 that is parallel to the long edge of the device (note there are two center symmetry planes). If the sensor contacts S1-S5 shift in y-direction, this mirror symmetry is lost and the current streamlines will tend to flow from the asymmetric contact towards the center of the doped well region 11 in the depth and dive up again towards the other ill-centered contact. Thus, any asymmetrical shift in the x- or y-direction results in a tilted current plane, that is also sensitive to magnetic fields applied in z-direction.

Cross-sensitivity is the additionally measured signal of a magnetic field when the field is applied perpendicular to the intended sensitivity direction of a sensor. Therefore, two cross-sensitive directions for a vertical Hall element should be considered.

An error of mask alignment affects the fabrication of integrated Hall sensors with one main consequence: the position of the contact regions in relation to the position of the doped well region 11 varies. Because of the uncertainty regarding the exact position of the sensor contacts S1-S5 on the top of the doped well region 11, one or more asymmetry detectors may be used to detect the exact position of the sensor contacts S1-S5 and compensate the sensor signal based on the detected position. In particular, asymmetries in sensor contact positions can be compensated and the sensor signal corrected.

By combining one lateral Hall element (for measuring the magnetic field in the z-direction) and two vertical Hall elements (for x and y), a genuine 3-D Hall sensor can be fabricated. In the examples provided herein, vertical Hall elements are used as X- and Y-sensors, and lateral Hall elements are used as Z-sensors.

Figure 2:
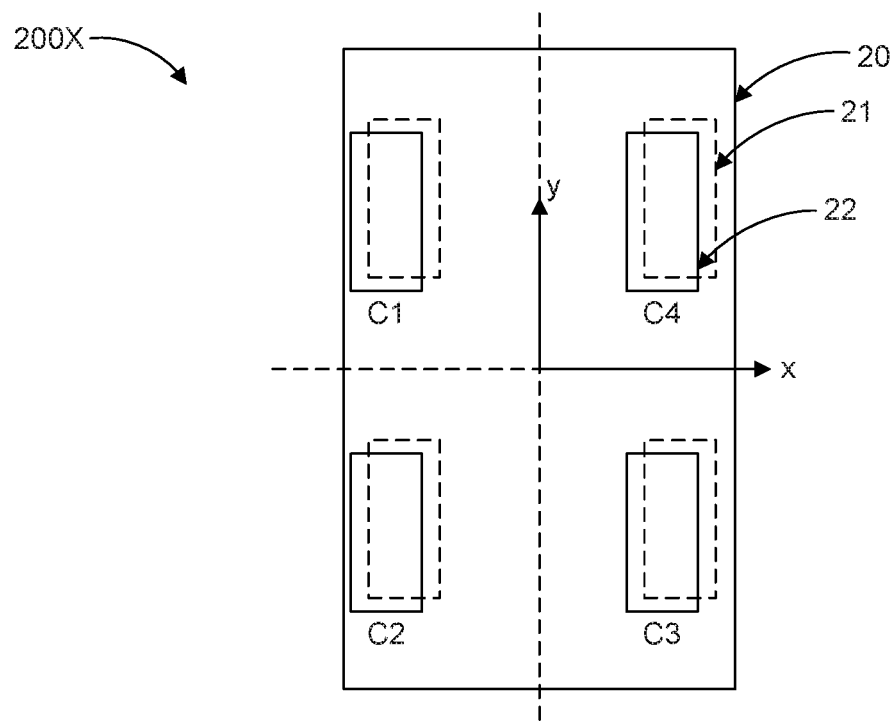
FIGS. 2 and 3 illustrate plan-views of a main surface of two asymmetry detectors, respectively, according to one or more embodiments.
Figure 3:
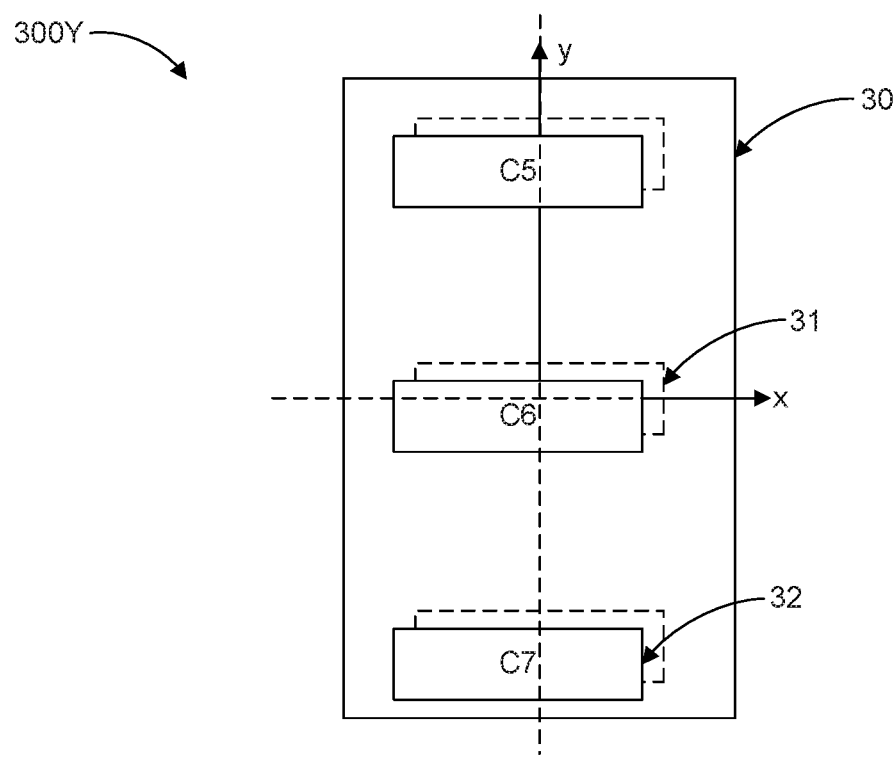

FIGS. 2 and 3 illustrate plan-views of a main surface of two asymmetry detectors 200x and 300y, respectively, according to one or more embodiments. In particular, asymmetry detector 200x is configured to detect an x-displacement of a contact-mask against a main tub-mask, where the main-tub mask is used for implanting a doped well region 20 (i.e., a detector main region) into the substrate 1 and the contact-mask is used for the implanting contacts into the doped well region 20. Additionally, the main tub-mask is used to implant the doped well region 11 of FIGS. 1A and 1B into the substrate 1, and the contact-mask is used for implanting the sensor contacts S1-S5 into the doped well region 11.

Thus, the doped well regions 11 and 20 are formed in the same processing step. Also, the contacts of the asymmetry detector 200x and the vertical Hall sensor element 10 are formed in another same processing step.

Similarly, the asymmetry detector 300y is configured to detect an y-displacement of a contact-mask against a main tub-mask.

Turning to FIG. 2, the asymmetry detector 200x includes four ohmic detector contacts C1-C4 (i.e., detector contacts) arranged in the Hall effect region of a doped well region 20 in a similar manner described with respect to sensor contacts S1-S5. Each contact C1-C4 has an elongated shape in the y-direction and is used to detect a shift in the x-direction. While the detector contacts have an elongated shape that extends in the y-direction, the shape thereof is not limited to a particular shape. For example, square detector contacts may be used. The x-direction corresponds to the sensing direction of a sensor element that is to be compensated by the asymmetry detector 200x. In other words, the asymmetry detector 200x is used in combination with an X-sensor to compensate an x-sensor signal.

The detector contacts C1-C4 are highly doped regions and are connected to wires or interconnect layers of metal or low poly-silicon (e.g., silicide) with tungsten plugs. The doped well region 20 and the detector contacts C1-C4 are built up of the same layers, doped-wells, diffusions/implantations as the Hall effect devices 10, whose asymmetry is to be detected. FIG. 2 shows a misalignment of the detector contacts C1-C4 against the doped well region 20 as it may occur due to misalignment of masks. The shown misalignment is a pure translation in negative x- and negative y-directions (i.e., no rotation).

FIG. 2 shows an ideal position 21 of each contact C1-C4 via a dotted outline and an actual position 22 of each contact C1-C4 via a solid outline. In this example, each contact C1-C4 is misaligned. For example, if all detector contacts C1-C4 are moved to the left, detector contacts C1, C2 approach the left perimeter of the doped well region 20, whereas C3, C4 move away from the right perimeter of the doped well region 20. Ideally, all detector contacts C1-C4 are equally spaced from the perimeter or boundary of the doped well region 20. Otherwise, a misalignment is present.

This misalignment can be detected by measuring the resistances R12 and R34 between detector contacts C1-C2 and C3-C4, respectively. Since detector contacts C1, C2 are closer to the perimeter than contacts C3, C4, movement for the charge carriers is more restrictive between the perimeter and detector contacts C1, C2 than between the perimeter and contacts C3, C4. This results in a higher resistance between detector contacts C1, C2 than between C3, C4. As a result, in FIG. 2, it holds: R12>R34 because detector contacts C1, C2 are closer to the perimeter than contacts C3, C4, where R12 is the resistance between detector contacts C1 and C2, and R34 is the resistance between contacts C3 and C4. In the event that the detector contacts C1-C4 were instead shifted in the positive x-direction, it would hold that R34>R12.

The measured resistances can thus be used to detect a displacement of the contacts in the x-direction. In particular, a misalignment in the x-direction is proportional to a ratio RAT of the resistances R12/R34. In other words, the ratio RAT (i.e., R12/R34) represents a measured cross-sensitivity caused by the misalignment. Thus, the ratio RAT (i.e., R12/R34) can be used to detect x-misalignment and to compensate the x-sensor signal. Furthermore, the ratio RAT is not affected by y-misalignment. In one or more examples, this ratio RAT may be referred to as RAT1. RAT1 is the ratio RAT of an asymmetry detector dedicated for a vertical Hall sensor element H1 (i.e., for an X-sensor element).

The spacing between detector contacts C1-C4 and the upper and lower boundaries of the tub should be larger than the spacing between contacts and the left and right boundaries of the doped well region 11. This ensures that the asymmetry detector 200x detects x-displacements, and not y-displacements. Also, the size of the detector contacts C1-C4 in y-direction may be larger than in x-direction to make the device responding mainly to x- instead of y-displacements of the detector contacts C1-C4 with respect to the doped well region 20. Also, the spacing between upper detector contacts C1, C4 and the spacing between lower contacts C2, C3 should not be too small, so that mismatch of distances C1-C2 and C3-C4 does not corrupt the measurement. The spacing of each contact from its nearest edge of the tub (i.e., from the edge of the doped well region 20) should be substantially equal to the largest expected shift.

In the case that the detector contacts C1-C4 have a square shape, as opposed to an elongated shape, the ratio R12/R34 would respond to x-displacement. However, the ratio R14/R24 would respond to y-displacement and may thus also be measured to compensate for a y-displacement. Thus, with an asymmetry detector similar to that shown in FIG. 2 but having 90° symmetry of its well and its contacts, a compensation system may measure both x- and y-shifts in the sensor/detector contacts.

It is to be noted that the asymmetry detector 200x and its operation (i.e., the measurement of resistances R12 and R34) is not affected by moderate magnetic fields nor by mechanical stress. In other words, the ratio R12/R34 does not depend on the magnetic field, the mechanicals stress, the temperature, or the doping concentration because such effects would appear as common factors in R12 and R34 and therefore they cancel out the ratio R12/R34.

For good matching with the Hall devices, the size of the detector contacts C1-C4 should be similar to the size of the sensor contacts S1-S5 of the sensor element 10, whose asymmetry is to be detected. Also the doped well region 20 should have similar size as the doped well region 11 of the respective sensor element 10. Both rules help to establish a good correlation between the asymmetry detector and sensor element (i.e., the Hall device) when the root cause of asymmetries is oblique implantation angle or out-diffusion.

As for the operation of the asymmetry detector 200x, there are numerous ways to measure the resistance of a resistive device. One method is to pass a known current through the asymmetry detector 200x and measure the potential drop. It is good practice to use Kelvin contacts for the force/sense contacts to avoid measurement errors. This is all the more important, if the device is not hard-wired to a voltmeter circuit and a current generator, but connected via switches (such as MOS transistors), which have significant Rds-on resistance.

The ratio of resistances may be measured directly without measuring the resistances individually. For example, if both resistances are connected in series and considered to be a left side of a Wheatstone bridge, and ordinary identical resistors are used as a right side of the bridge, then the bridge output may be measured by supplying the bridge with a voltage and measuring the bridge output.

Turning to FIG. 3, the asymmetry detector 300y includes three ohmic detector contacts C5-C7 (i.e., detector contacts) arranged in the Hall effect region of a doped well region 30 (i.e., a detector main region) in a similar manner described with respect to sensor contacts S1-S5. Each contact C5-C7 has an elongated shape in the x-direction and is used to detect a shift in the y-direction. While the detector contacts have an elongated shape that extends in the x-direction, the shape thereof is not limited to a particular shape. For example, square detector contacts may be used. The y-direction corresponds to the sensing direction of a sensor element that is to be compensated by the asymmetry detector 300y. In other words, the asymmetry detector 300y is used in combination with a Y-sensor to compensate an y-sensor signal.

The detector contacts C5-C7 are highly doped regions and are connected to wires or interconnect layers of metal or low poly-silicon (e.g., silicide) with tungsten plugs. The doped well region 30 and the detector contacts C5-C7 are built up of the same layers, doped-wells, diffusions/implantations as the Hall effect devices 10, whose asymmetry is to be detected. FIG. 3 shows a misalignment of the detector contacts C5-C7 against the doped well region 30 as it may occur due to misalignment of masks. The shown misalignment is a pure translation in negative x- and negative y-directions (i.e., no rotation).

FIG. 3 shows an ideal position 31 of each contact C5-C7 via a dotted outline and an actual position 32 of each contact C5-C7 via a solid outline. In this example, each contact C5-C7 is misaligned. For example, if all detector contacts C5-C7 are moved synchronously left and down, contact C7 approaches the lower perimeter of the doped well region 30, whereas contact C5 moves away from the upper perimeter of the doped well region 30. Ideally, detector contacts C5 and C7 are equally spaced from the perimeter of the doped well region 30, with contact C6 symmetrically disposed therebetween. Otherwise, a misalignment is present.

In this case, since the distance between C7 and the lower perimeter of the doped well region 30 is less than the distance between C5 and the upper perimeter of the doped well region 30, R67>R65, where R67 is the resistance between contacts C6 and C7, and R65 is the resistance between contacts C6 and C5. In the event that the detector contacts C5-C7 were instead shifted in the positive y-direction, it would hold that R65>R67.

The measured resistances can thus be used to detect a displacement of the contacts in the y-direction. In particular, a misalignment in the y-direction is proportional to a ratio RAT of the resistances R67/R65. In other words, the ratio RAT (i.e., R67/R65) represents a measured cross-sensitivity caused by the misalignment. Thus, the ratio RAT (i.e., R67/R65) can be used to detect y-misalignment and to compensate the y-sensor signal. Furthermore, the ratio RAT is not affected by x-misalignment. In one or more examples, this ratio RAT may be referred to as RAT2. RAT2 is the ratio RAT of an asymmetry detector dedicated for a vertical Hall sensor element H3 (i.e., for an Y-sensor element).

The ratio of resistances may be measured directly without measuring the resistances individually. For example, if both resistances are connected in series and considered to be a left side of a Wheatstone bridge, and ordinary identical resistors are used as a right side of the bridge, then the bridge output may be measured by suppling the bridge with a voltage and measuring the bridge output.

As will be demonstrated in further examples, the asymmetry detector 200x may be rotated by 90° (e.g., counterclockwise) in order to detect a y-displacement instead of x-displacement between contacts and the doped well region 20. Such an asymmetry detector may be referred to as asymmetry detector 200y in one or more embodiments. This arrangement would be used, for example, to determine a value for ratio RAT2 in conjunction with a Y-sensor H3 to compensate a y-sensor signal.

Similarly, as will be demonstrated in further examples, the asymmetry detector 300y may be rotated by 90° (e.g., counterclockwise) in order to detect a x-displacement instead of y-displacement between contacts and doped well region 30. Such an asymmetry detector may be referred to as asymmetry detector 300x in one or more embodiments. This arrangement would be used, for example, to determine a value for ratio RAT1 in conjunction with an X-sensor H1 to compensate an x-sensor signal.

It will be further appreciated that the asymmetry detectors 200x, 200y, 300x, and 300y may also be used as vertical Hall effect devices (i.e., sensor elements), which would improve manufacturing efficiencies.

As will be described in greater detail, the asymmetry detector 200x and a vertical Hall effect device (i.e., an X-sensor element) may be integrated on a first sensor chip and the asymmetry detector 200y and a vertical Hall effect device (i.e., an Y-sensor element) may be integrated on a second sensor chip. Alternatively, the asymmetry detector 200x, the X-sensor element, the asymmetry detector 200y, and the Y-sensor element may be integrated on a single sensor chip.

It will also be appreciated that other circuit and processing components may also be integrated on a chip separate from the sensor chip(s), or may be integrated on a sensor chip.

A sensor system according to one or more embodiments has one vertical Hall sensor element H1 (i.e., an X-sensor element Hx) for measuring Bx and one Hall plate H2 (i.e., one lateral Hall sensor element, also referred to as a Z-sensor element Hz) for measuring Bz. This sensor system also includes an asymmetry detector 200x or 300x for detecting x-shift/asymmetry for compensating the sensor signal of the sensor element Hx.

Alternatively, a sensor system according to one or more embodiments has one vertical Hall sensor element H3 (i.e., a Y-sensor element Hy) for measuring By and one Hall plate H2 (i.e., Z-sensor element Hz) for measuring Bz. This sensor system also includes an asymmetry detector 200y or 300y for detecting q-shift/asymmetry for compensating the sensor signal of the sensor element Hy.

Alternatively, a sensor system according to one or more embodiments includes Hall sensor elements H1, H2, and H3, an asymmetry detector 200x or 300x for detecting x-shift/asymmetry for compensating the sensor signal of the sensor element Hx, and an asymmetry detector 200y or 300y for detecting q-shift/asymmetry for compensating the sensor signal of the sensor element Hy. In this case, a dedicated Hall plate H2 (i.e., Z-sensor element Hz) may be used by each asymmetry detector, or the asymmetry detectors may use a sensor signal from the same sensor element H2 for their respective signal cross-talk compensations.

Thus, according to one example, the sensor system includes at least two Hall effect devices H1, H2 (or H2, H3), that detect magnetic fields in two orthogonal directions 1 and 2, respectively, if asymmetries are absent. If asymmetry is present, there is a magnetic cross-talk.

In the following examples, a first Hall effect device H1 may be a vertical Hall effect device such as an X-sensor element Hx, second Hall effect device H2 may be a lateral Hall effect device such as a Z-sensor element Hz, and a third Hall effect device H3 may be a vertical Hall effect device such as a Y-sensor element Hy.

It will be appreciated that the specific main sensitive and cross-sensitive directions are arbitrary. In general, the a first Hall effect device H1 has a main sensitivity to a first in-plane magnetic field component, a third Hall effect device H3 has a main sensitivity to a second in-plane magnetic field component orthogonal to the first in-plane magnetic field component, and the second Hall effect device H2 has a main sensitivity to an out-of-plane field component that is orthogonal to both the first in-plane magnetic field component and the second in-plane magnetic field component.

The Hall plate H2 is not affected by asymmetry. A. The cross-talk caused by asymmetries of an Hx-sensor device or an Hy-sensor device leads to a small magnetic sensitivity of Hx or Hy, respectively, to Bz-fields. To this end, the Z-sensor element Hz is used to correct the Hx-sensor signal and/or the Hy-sensor signal from unwanted Bz-cross-talk.

Magnetic cross-talk can be described by the following equations:

$$Sig1 = S11*B1 + S12*B2 \quad \text{Eq. 1}$$

$$Sig2 = S22*B2 \quad \text{Eq. 2}$$

$$Sig3 = S33*B3 + S32*B2 \quad \text{Eq. 3}$$

$$S12/S11 = CX1*(RAT1-1) \quad \text{Eq. 4}$$

$$S32/S33 = CY1*(RAT2-1) \quad \text{Eq. 5}$$

$$S12 = S11*CX1*(RAT1-1) \quad \text{Eq. 6}$$

$$S32 = S33*CY1*(RAT2-1) \quad \text{Eq. 7}$$

$$B1 = Sig1/S11 + CX1*(1-RAT1)*Sig2/S22 \quad \text{Eq. 8}$$

$$B2 = Sig2/S22 \quad \text{Eq. 9}$$

$$B3 = Sig3/S33 + CY1*(1-RAT2)*Sig2/S22 \quad \text{Eq. 10}$$

Sig1 is the output signal (i.e., sensor signal) of Hall effect device H1 (Hx), Sig2 is the output signal of Hall effect device H2 (Hz), Sig3 is the output signal of Hall effect device H3 (Hy), B1 is the magnetic field in direction 1 (i.e., the x-directional magnetic field component Bx), B2 is the magnetic field in direction 2 (e.g., in the z-directional magnetic field component Bz), and B3 is the magnetic field in direction 3 (i.e., the y-directional magnetic field component By). The x- and y-directions represent the sensor plane of the substrate 1, whereas the z-direction is "out-of-plane" or orthogonal to the sensor plane.

S11 and S12 are coefficients of the Hall effect device H1 representative of the magnetic sensitivity to a magnetic field in one direction, where S11 is the magnetic sensitivity to a magnetic field in direction 1 (Bx) and S12 is the magnetic sensitivity to a magnetic field in direction 2 (Bz).

S22 is a coefficient of the Hall effect device H2 representative of the magnetic sensitivity to a magnetic field in direction 2 (Bz).

S33 and S32 are coefficients of the Hall effect device H3 representative of the magnetic sensitivity to a magnetic field in one direction, where S33 is the magnetic sensitivity to a magnetic field in direction 3 (By) and S32 is the magnetic sensitivity to a magnetic field in direction 2 (Bz).

In the absence of asymmetry, it holds that S12=S32=0. As noted above, the Hall plate H2 is not affected by asymmetry. Whenever the devices have small asymmetries it holds that |S12|<<|S11| and |S32|<<|S33|.

The coefficient CX1 depends on the exact geometry of H1, H2, and the asymmetry detector 200x or 300x and is determined by laboratory evaluation or by numerical computation and subsequently programmed or hard-wired into the cross-talk compensation circuit. If RAT1=1, there is no x-asymmetry and therefore also no cross-talk (i.e., S12=0).

Similarly, the coefficient CY1 depends on the exact geometry of H3, H2, and the asymmetry detector 200y or 300y and is determined by laboratory evaluation or by numerical computation and subsequently programmed or hard-wired into the cross-talk compensation circuit. If RAT2=1, there is no y-asymmetry and therefore also no cross-talk (i.e., S32=0).

Based on the cross-talk compensation procedure described herein, it follows that there is a statistical correlation between RAT1 and S12/S11, where RAT1 is the ratio of an asymmetry detector 200x or 300x dedicated for Hall effect device H1 (e.g., an x-sensor element Hx). For small asymmetries, it is a linear relationship: S12/S11=CX1*(RAT1-1).

Similarly, there is a statistical correlation between RAT2 and S32/S33, where RAT2 is the ratio of an asymmetry detector 200y or 300y dedicated for Hall effect device H3 (e.g., an x-sensor element Hy). For small asymmetries it is a linear relationship: S32/S33=CY1*(RAT2-1).

Based on the above equations, the output signals Sig1 and Sig3 can be compensated for magnetic cross-talk in order to derive a compensated measurement signal SigOUT1 or SigOUT2 that are representative of the respective magnetic field components Bx and By. Thus, B1 is a linear combination of Sig1 and Sig2 with coefficients that depend on the asymmetry detector 200x or 300x, and B3 is a linear combination of Sig3 and Sig2 with coefficients that depend on the asymmetry detector 200y or 300y. If one wants to avoid divisions by RAT1, RAT2, one may linearize the result for small asymmetries. These computations can be done by a processing circuit executing computer code, in the digital domain of a mixed-signal circuit, or by analog circuits.

The cross-talk caused by asymmetries of the Hx-device and the Hy-device leads to a small magnetic sensitivity of Hx and Hy to Bz-fields. The system shown in the following examples corrects the Hx-signal and the Hy-signal from unwanted Bz-cross-talk.

Figure 4:
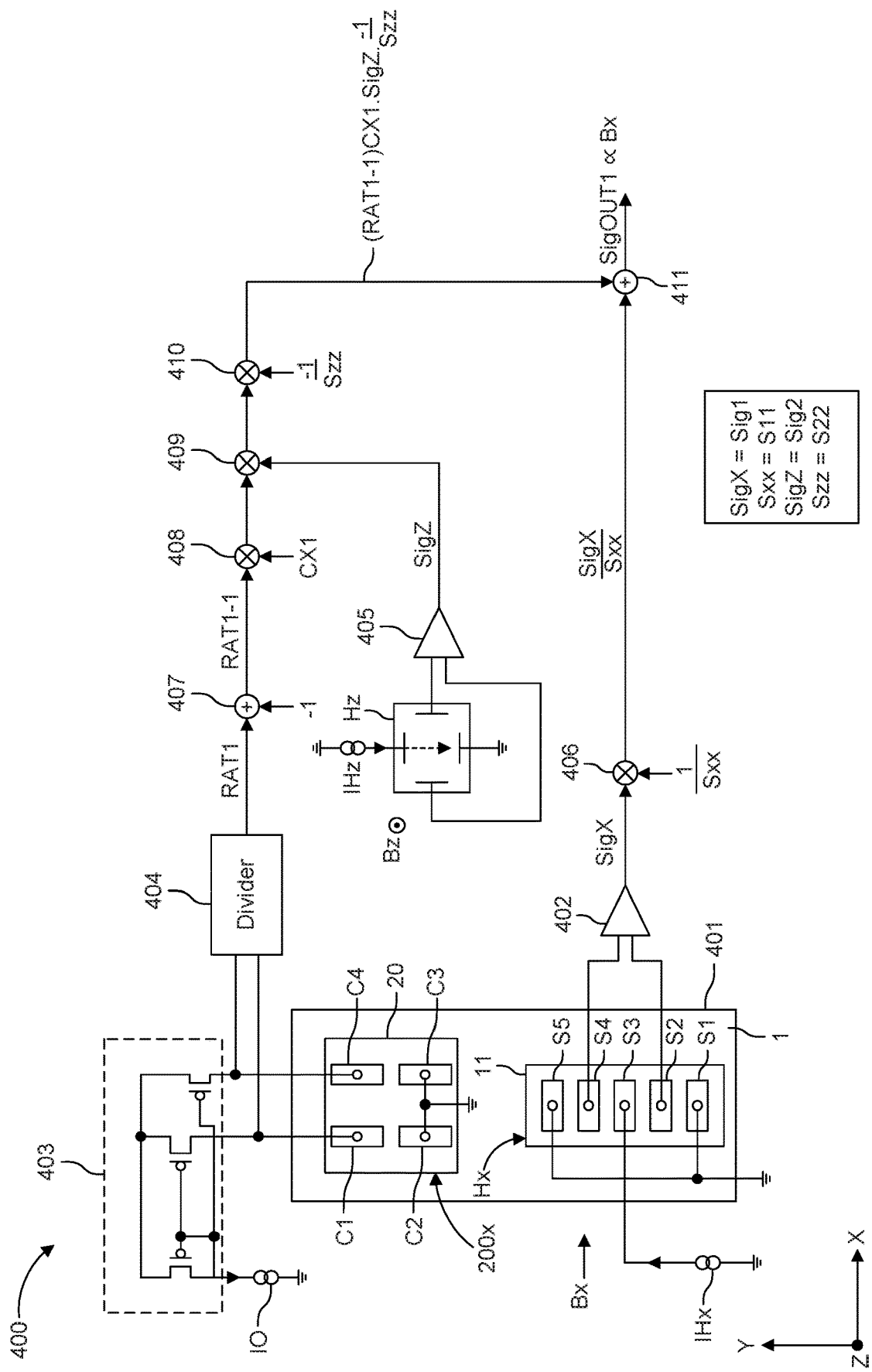
FIG. 4 illustrates a schematic diagram of a sensor cross-talk compensation system according to one or more embodiments.

FIG. 4 illustrates a schematic diagram of a sensor cross-talk compensation system 400 according to one or more embodiments. The sensor cross-talk compensation system 400 includes a sensor chip 401 comprising a substrate 1. the sensor chip 401 further includes a vertical Hall sensor element Hx and an asymmetry detector 200x that are formed into the substrate 1.

Specifically, the vertical Hall sensor element Hx, also referred to as H1, is configured to measure Bx magnetic fields. It includes a doped well region 11 and sensor contacts S1-S5 as similarly described in conjunction with FIGS. 1A and 1B. The asymmetry detector 200x includes a doped well region 20 and detector contacts C1-C4 as similarly described in conjunction with FIG. 2. Furthermore, the size and shape of the doped well regions 11 and 20 may be matched. Likewise, the size and shape of the sensor contacts S1-S5 and detector contacts C1-C4 may be matched. The asymmetry detector 200x is configured to measuring x-shift/asymmetry for compensating the sensor signal SigX of the sensor element Hx.

The sensor cross-talk compensation system 400 further includes a current source IHx that is configured to inject a sensor current into sensor contact S3 such that a Hall voltage can be measured across sensor contacts S2 and S4 via an operational amplifier 402. The operational amplifier 402, which may be a differential amplifier or other differential circuitry, is configured receive a voltage at a first input terminal and a voltage at a second input terminal, and output a sensor signal SigX (Sig1) that represents a potential drop across sensor contacts S2 and S4 that is dependent on Bx.

A current source I0 is connected to a current mirror arrangement 403 having PMOS current mirrors that force currents into two detector contacts C1, C4 of the asymmetry detector 200x. A divider 404 is connected to each force contact C1, C4 in order to detect the resistance R12 between C1, C2 and the resistance R34 between C3, C4, and to measure a ratio RAT1 (R12/R34) therebetween. Thus, the divider 404 is configured to determine RAT1 and output a signal representative thereof.

Thus, the doped well region 20 (i.e., the detector main region) includes a first peripheral edge (e.g., a left edge) and a second peripheral edge (e.g., a right edge) oppositely arranged from the first peripheral edge in a main sensitivity direction (i.e., the x-direction) of the vertical Hall sensor element.

The detector contacts C1-C4 are grouped into pairs, with C1 and C2 being a first pair having a first resistance R12 therebetween and C3 and C4 being a second pair having a second resistance R34 therebetween. A first detector contact of the first pair of detector contacts is arranged from the first peripheral edge by a first distance. Similarly, a first detector contact of the second pair of detector contacts is arranged from the second peripheral edge by a second distance. The first detector contact of the first pair of detector contacts and the first detector contact of the second pair of detector contacts may be C1 and C4, respectively. Alternatively, they may be C2 or C3, respectively. Thus, the first detector contact of the first pair of detector contacts and the first detector contact of the second pair of detector contacts are aligned with each other in the main sensitivity direction of the vertical Hall sensor element. In this case, they are aligned in the x-direction.

Based on this arrangement, the first resistance R12 and the second resistance R34 are equal on a condition that the first distance and the second distance are equal, the first resistance R12 is greater than the second resistance R34 on a condition that the first distance is less than the second distance, and the first resistance R12 is less than the second resistance R34 on a condition that the first distance is greater than the second distance.

The divider 404 is a resistance measurement circuit configured measure a first resistance between a first pair of detector contacts of the at least three detector contacts and measure a second resistance between a second pair of detector contacts of the at least three detector contacts and/or a ratio measurement circuit configured to determine a ratio between the first resistance and the second resistance.

The sensor cross-talk compensation system 400 further includes a lateral Hall sensor element Hz (i.e., a Hall plate), also referred to as H2, that is configured to measure Bz magnetic fields. A current source IHz is configured to inject a sensor current into the sensor element Hz and a potential difference across the device, perpendicular to the current flow, is measured by an operational amplifier 405. The operational amplifier 405, which may be a differential amplifier or other differential circuitry, is configured to receive a voltage at a first input terminal and a voltage at a second input terminal, and output a sensor signal SigZ (Sig2) that represents a potential difference across the Hall plate that is dependent on Bz.

With sensor signals SigX and SigZ known, along with ratio RAT1 derived from the asymmetry detector 200x, the sensor signal SigX can be compensated in order to counteract any magnetic cross-talk caused by a cross-sensitivity of sensor element Hx to Bz due to an x-shift/asymmetry.

Accordingly, a cross-talk compensation circuit includes a multiplier 406 that is configured to multiply SigX with the inverse of Sxx (S11) to derive a value SigX/Sxx.

The cross-talk compensation circuit further includes an adder 407 that adds −1 to RAT1 to derive a value (RAT1−1). Further downstream, a multiplier 408 is provided that multiplies (RAT1−1) with CX1. Further downstream, a multiplier 409 is provided that multiplies the output of multiplier 408 with the sensor signal SigZ. Further downstream, a multiplier 410 is provided that multiplies the output of multiplier 409 with the negative inverse of Szz (S22). Lastly, the outputs of multipliers 406 and 410 are combined by adder 411 to generate a compensated measurement signal SigOUT1 that is representative of the magnetic field component Bx, where SigOUT1=Sig1/S11+CX1*(1−RAT1)*Sig2/S22.

Figure 5:
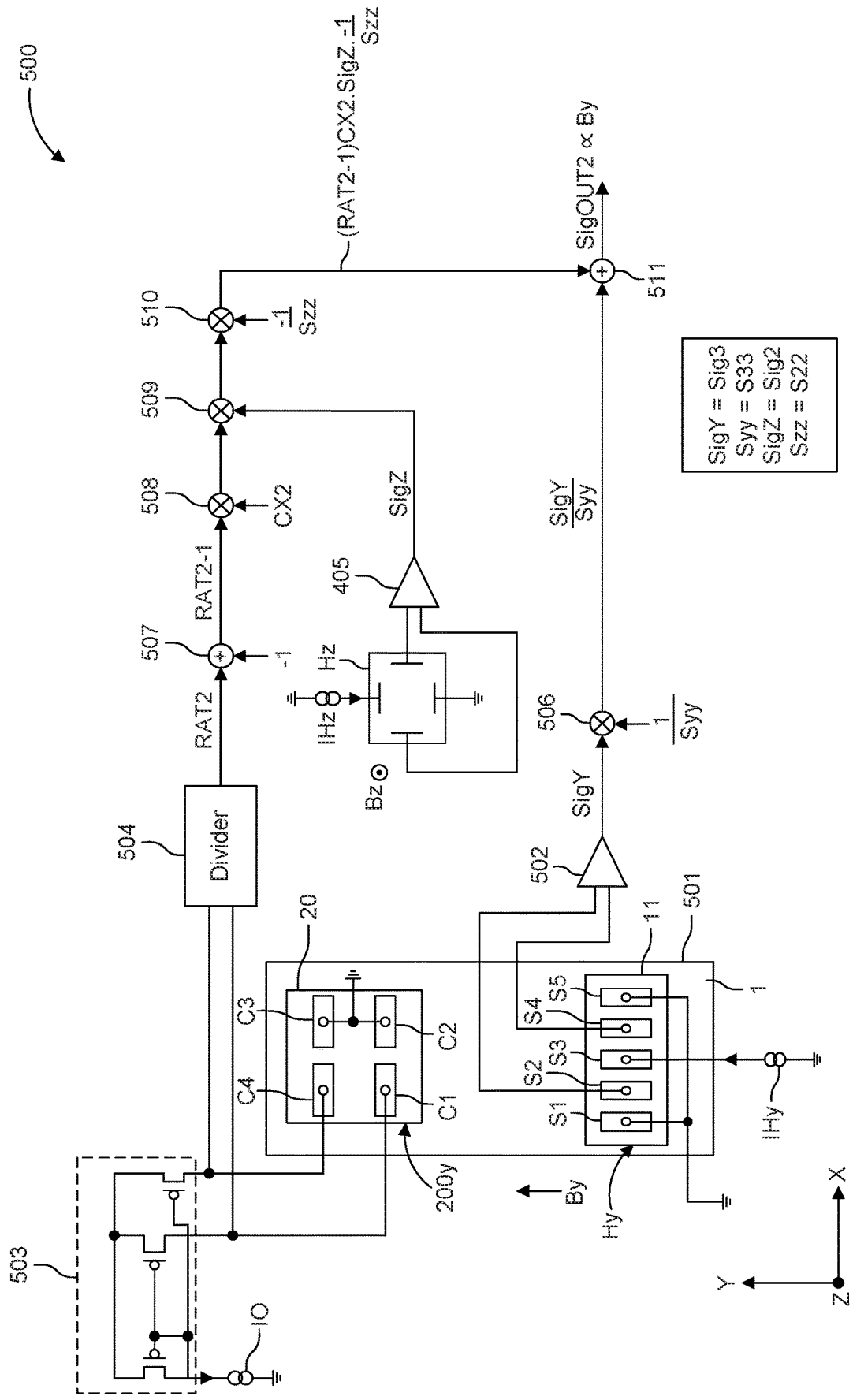
FIG. 5 illustrates a schematic diagram of another sensor cross-talk compensation system according to one or more embodiments.

FIG. 5 illustrates a schematic diagram of a sensor cross-talk compensation system 500 according to one or more embodiments. The sensor cross-talk compensation system 500 includes a sensor chip 501 comprising a substrate 1. the sensor chip 501 further includes a vertical Hall sensor element Hy and an asymmetry detector 200y that are formed into the substrate 1.

Specifically, the vertical Hall sensor element Hy, also referred to as H3, is configured to measure By magnetic fields. It includes a doped well region 11 and sensor contacts S1-S5 as similarly described in conjunction with FIGS. 1A and 1B. The asymmetry detector 200y includes a doped well region 20 and detector contacts C1-C4 as similarly described in conjunction with FIG. 2. Furthermore, the size and shape of the doped well regions 11 and 20 may be matched. Likewise, the size and shape of the sensor contacts S1-S5 and detector contacts C1-C4 may be matched. The asymmetry detector 200y is configured to measuring q-shift/asymmetry for compensating the sensor signal SigY of the sensor element Hy.

Thus, the doped well region 20 (i.e., the detector main region) includes a first peripheral edge (e.g., a bottom edge) and a second peripheral edge (e.g., a top edge) oppositely arranged from the first peripheral edge in a main sensitivity direction (i.e., the y-direction) of the vertical Hall sensor element.

The detector contacts C1-C4 are grouped into pairs, with C1 and C2 being a first pair having a first resistance R12 therebetween and C3 and C4 being a second pair having a second resistance R34 therebetween. A first detector contact of the first pair of detector contacts is arranged from the first peripheral edge by a first distance. Similarly, a first detector contact of the second pair of detector contacts is arranged from the second peripheral edge by a second distance. The first detector contact of the first pair of detector contacts and the first detector contact of the second pair of detector contacts may be C1 and C4, respectively. Alternatively, they may be C2 or C3, respectively. Thus, the first detector contact of the first pair of detector contacts and the first detector contact of the second pair of detector contacts are aligned with each other in the main sensitivity direction of the vertical Hall sensor element. In this case, they are aligned in the y-direction.

Based on this arrangement, the first resistance R12 and the second resistance R34 are equal on a condition that the first distance and the second distance are equal, the first resistance R12 is greater than the second resistance R34 on a condition that the first distance is less than the second distance, and the first resistance R12 is less than the second resistance R34 on a condition that the first distance is greater than the second distance.

The sensor cross-talk compensation system 500 further includes a current source IHy that is configured to inject a sensor current into sensor contact S3 such that a Hall voltage can be measured across sensor contacts S2 and S4 via an operational amplifier 502. The operational amplifier 502, which may be a differential amplifier or other differential circuitry, is configured receive a voltage at a first input terminal and a voltage at a second input terminal, and output a sensor signal SigY (Sig3) that represents a potential drop across sensor contacts S2 and S4 that is dependent on By.

A current source JO is connected to a current mirror arrangement 503 having PMOS current mirrors that force currents into two detector contacts C1, C4 of the asymmetry detector 200y. A divider 504 is connected to each force contact C1, C4 in order to detect the resistance R12 between C1, C2 and the resistance R34 between C3, C4, and to measure a ratio RAT1 (R12/R34) therebetween. Thus, the divider 504 is configured to determine RAT2 and output a signal representative thereof. The divider 504 is a resistance measurement circuit configured measure a first resistance between a first pair of detector contacts of the at least three detector contacts and measure a second resistance between a second pair of detector contacts of the at least three detector contacts and/or a ratio measurement circuit configured to determine a ratio between the first resistance and the second resistance.

The sensor cross-talk compensation system 500 further includes a lateral Hall sensor element Hz (i.e., a Hall plate), also referred to as H2, that is configured to measure Bz magnetic fields. A current source IHz is configured to inject a sensor current into the sensor element Hz and a potential difference across the device, perpendicular to the current flow, is measured by an operational amplifier 405. The operational amplifier 405, which may be a differential amplifier or other differential circuitry, is configured receive a voltage at a first input terminal and a voltage at a second input terminal, and output a sensor signal SigZ (Sig2) that represents a potential difference across the Hall plate that is dependent on Bz.

With sensor signals SigY and SigZ known, along with ratio RAT2 derived from the asymmetry detector 200y, the sensor signal SigY can be compensated in order to counteract any magnetic cross-talk caused by a cross-sensitivity of sensor element Hy to Bz due to an y-shift/asymmetry.

Accordingly, a cross-talk compensation circuit includes a multiplier 506 that is configured to multiply SigY with the inverse of Syy (S33) to derive a value SigY/Syy.

The cross-talk compensation circuit further includes an adder 507 that adds −1 to RAT2 to derive a value (RAT2−1). Further downstream, a multiplier 508 is provided that multiplies (RAT2−1) with CX2. Further downstream, a multiplier 509 is provided that multiplies the output of multiplier 508 with the sensor signal SigZ. Further downstream, a multiplier 510 is provided that multiplies the output of multiplier 509 with the negative inverse of Szz (S22). Lastly, the outputs of multipliers 506 and 510 are combined by adder 511 to generate a compensated measurement signal SigOUT2 that is representative of the magnetic field component By, where SigOUT2=Sig3/S33+CY1*(1−RAT2)*Sig2/S22.

Figure 6:
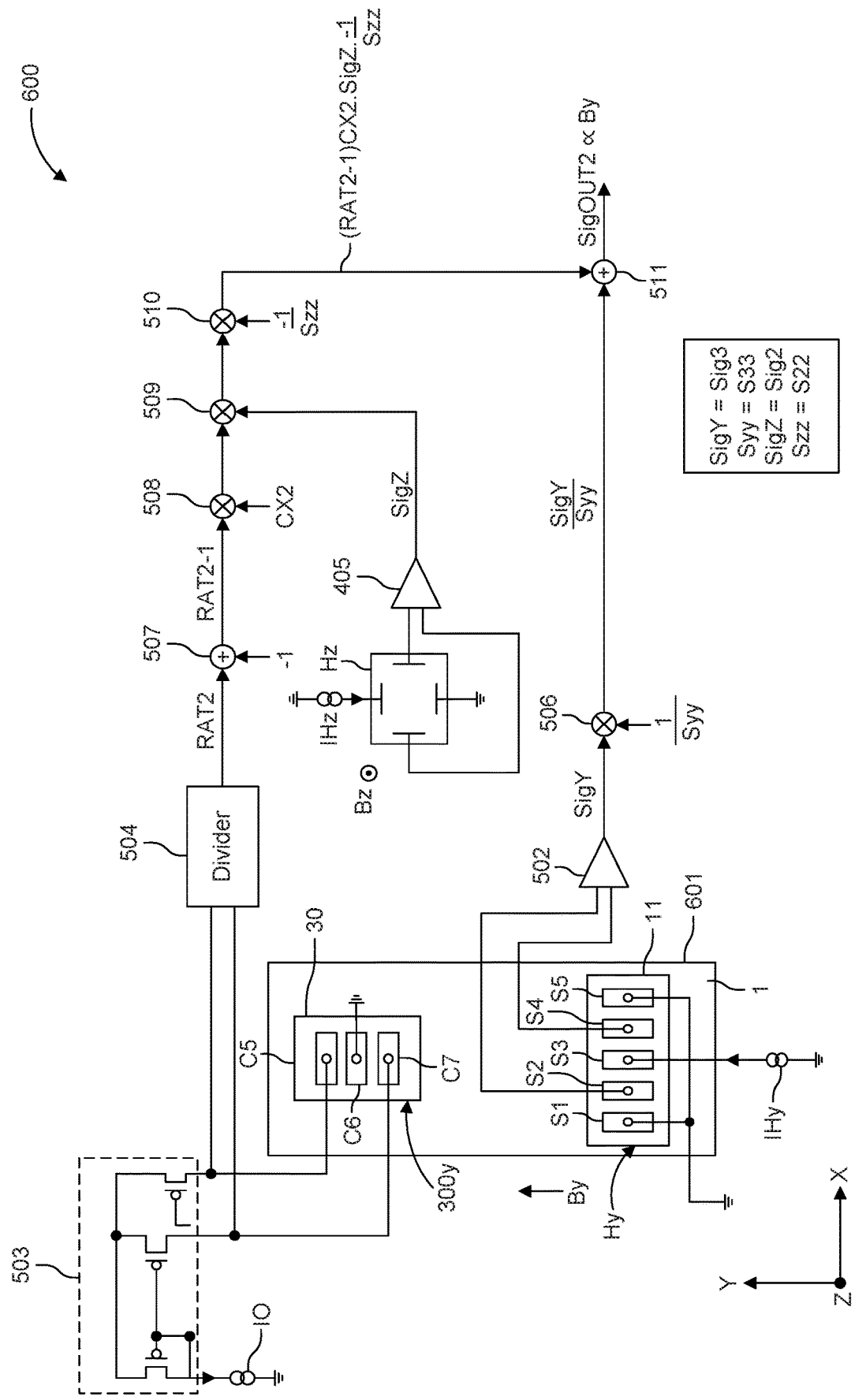
FIG. 6 illustrates a schematic diagram of another sensor cross-talk compensation system according to one or more embodiments.

FIG. 6 illustrates a schematic diagram of a sensor cross-talk compensation system 600 according to one or more embodiments. The sensor cross-talk compensation system 600 includes a sensor chip 601 comprising a substrate 1. the sensor chip 601 further includes a vertical Hall sensor element Hy and an asymmetry detector 300y that are formed into the substrate 1.

Specifically, the vertical Hall sensor element Hy, also referred to as H3, is configured to measure By magnetic fields. It includes a doped well region 11 and sensor contacts S1-S5 as similarly described in conjunction with FIGS. 1A and 1B. The asymmetry detector 300y includes a doped well region 30 and detector contacts C5-C7 as similarly described in conjunction with FIG. 3. Furthermore, the size and shape of the doped well regions 11 and 30 may be matched. Likewise, the size and shape of the sensor contacts S1-S5 and detector contacts C5-C7 may be matched. The asymmetry detector 300y is configured to measuring q-shift/asymmetry for compensating the sensor signal SigY of the sensor element Hy.

Thus, the doped well region 30 (i.e., the detector main region) includes a first peripheral edge (e.g., a bottom edge) and a second peripheral edge (e.g., a top edge) oppositely arranged from the first peripheral edge in a main sensitivity direction (i.e., the y-direction) of the vertical Hall sensor element.

The detector contacts C5-C7 are grouped into pairs, with C6 and C7 being a first pair having a first resistance R67 therebetween and C6 and C5 being a second pair having a second resistance R65 therebetween. A first detector contact of the first pair of detector contacts is arranged from the first peripheral edge by a first distance. Similarly, a first detector contact of the second pair of detector contacts is arranged from the second peripheral edge by a second distance. The first detector contact of the first pair of detector contacts and the first detector contact of the second pair of detector contacts may be C7 and C5, respectively. Thus, the first detector contact of the first pair of detector contacts and the first detector contact of the second pair of detector contacts are aligned with each other in the main sensitivity direction of the vertical Hall sensor element. In this case, they are aligned in the y-direction.

Based on this arrangement, the first resistance R67 and the second resistance R65 are equal on a condition that the first distance and the second distance are equal, the first resistance R67 is greater than the second resistance R65 on a condition that the first distance is less than the second distance, and the first resistance R67 is less than the second resistance R65 on a condition that the first distance is greater than the second distance.

The sensor cross-talk compensation system 600 further includes a current source IHy that is configured to inject a sensor current into sensor contact S3 such that a Hall voltage can be measured across sensor contacts S2 and S4 via an operational amplifier 502. The operational amplifier 502, which may be a differential amplifier or other differential circuitry, is configured receive a voltage at a first input terminal and a voltage at a second input terminal, and output a sensor signal SigY (Sig3) that represents a potential drop across sensor contacts S2 and S4 that is dependent on By.

A current source J0 is connected to a current mirror arrangement 503 having PMOS current mirrors that force currents into two detector contacts C5, C7 of the asymmetry detector 300y. A divider 504 is connected to each force contact C5, C7 in order to detect the resistance R67 between C6, C7 and the resistance R65 between C6, C5, and to measure a ratio RAT2 (R67/R65) therebetween. Thus, the divider 504 is configured to determine RAT2 and output a signal representative thereof.

The sensor cross-talk compensation system 600 further includes a lateral Hall sensor element Hz (i.e., a Hall plate), also referred to as H2, that is configured to measure Bz magnetic fields. A current source IHz is configured to inject a sensor current into the sensor element Hz and a potential difference across the device, perpendicular to the current flow, is measured by an operational amplifier 405. The operational amplifier 405, which may be a differential amplifier or other differential circuitry, is configured receive a voltage at a first input terminal and a voltage at a second input terminal, and output a sensor signal SigZ (Sig2) that represents a potential difference across the Hall plate that is dependent on Bz.

With sensor signals SigY and SigZ known, along with ratio RAT2 derived from the asymmetry detector 300y, the sensor signal SigY can be compensated in order to counteract any magnetic cross-talk caused by a cross-sensitivity of sensor element Hy to Bz due to an y-shift/asymmetry.

Accordingly, a cross-talk compensation circuit includes a multiplier 506 that is configured to multiply SigY with the inverse of Syy (S33) to derive a value SigY/Syy.

The cross-talk compensation circuit further includes an adder 507 that adds −1 to RAT2 to derive a value (RAT2−1). Further downstream, a multiplier 508 is provided that multiplies (RAT2−1) with CX2. Further downstream, a multiplier 509 is provided that multiplies the output of multiplier 508 with the sensor signal SigZ. Further downstream, a multiplier 510 is provided that multiplies the output of multiplier 509 with the negative inverse of Szz (S22). Lastly, the outputs of multipliers 506 and 510 are combined by adder 511 to generate a compensated measurement signal SigOUT2 that is representative of the magnetic field component By, where SigOUT2=Sig3/S33+CY1*(1−RAT2)*Sig2/S22.

Figure 7:
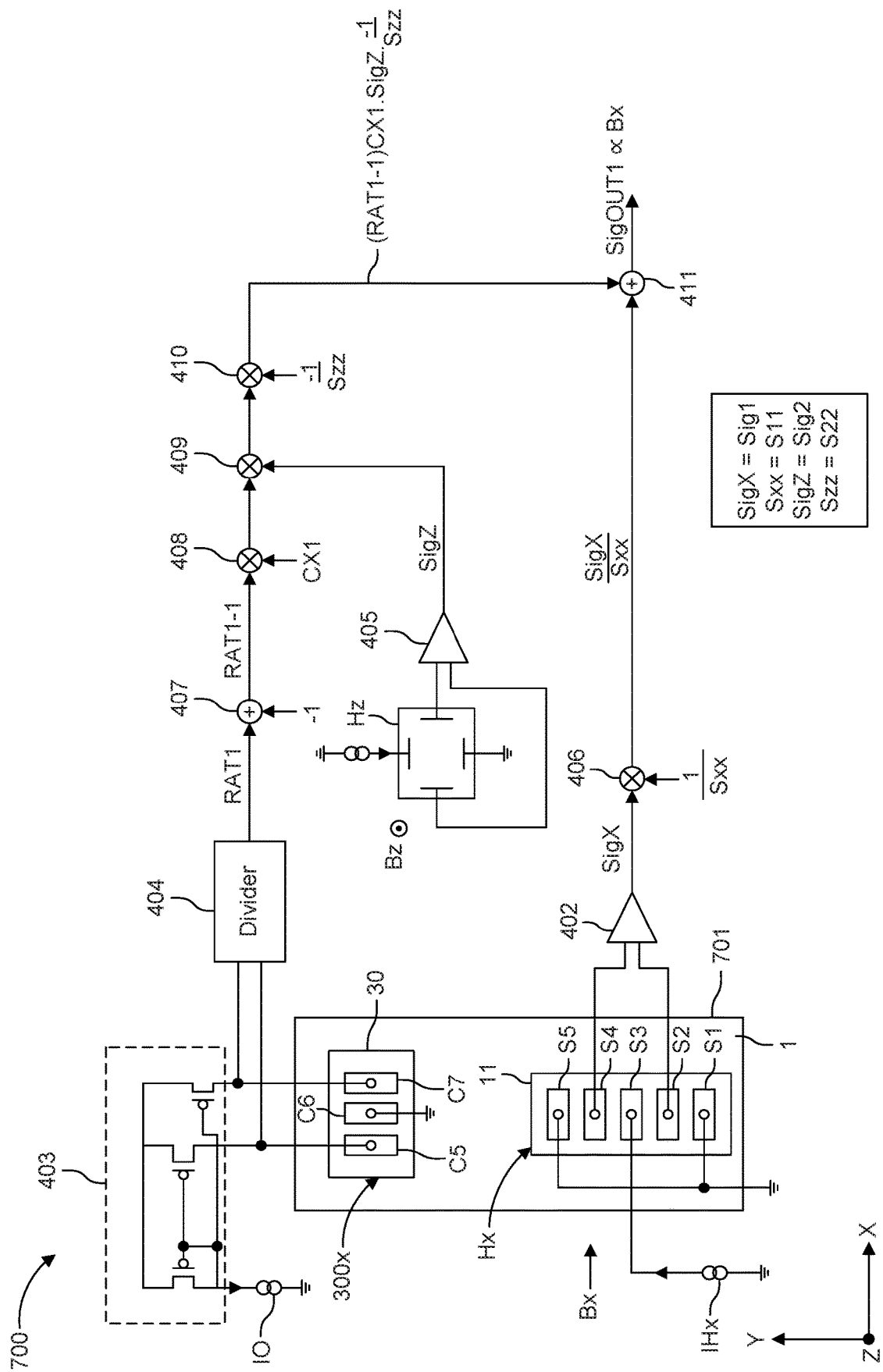
FIG. 7 illustrates a schematic diagram of another sensor cross-talk compensation system according to one or more embodiments.

FIG. 7 illustrates a schematic diagram of a sensor cross-talk compensation system 700 according to one or more embodiments. The sensor cross-talk compensation system 700 includes a sensor chip 701 comprising a substrate 1. the sensor chip 701 further includes a vertical Hall sensor element Hx and an asymmetry detector 300x that are formed into the substrate 1.

Specifically, the vertical Hall sensor element Hx, also referred to as H1, is configured to measure Bx magnetic fields. It includes a doped well region 11 and sensor contacts S1-S5 as similarly described in conjunction with FIGS. 1A and 1B. The asymmetry detector 300x includes a doped well region 30 and detector contacts C5-C7 as similarly described in conjunction with FIG. 3. Furthermore, the size and shape of the doped well regions 11 and 30 may be matched. Likewise, the size and shape of the sensor contacts S1-S5 and detector contacts C5-C7 may be matched. The asymmetry detector 300x is configured to measuring x-shift/asymmetry for compensating the sensor signal SigX of the sensor element Hx.

Thus, the doped well region 30 (i.e., the detector main region) includes a first peripheral edge (e.g., a right edge) and a second peripheral edge (e.g., a left edge) oppositely arranged from the first peripheral edge in a main sensitivity direction (i.e., the x-direction) of the vertical Hall sensor element.

The detector contacts C5-C7 are grouped into pairs, with C6 and C7 being a first pair having a first resistance R67 therebetween and C6 and C5 being a second pair having a second resistance R65 therebetween. A first detector contact of the first pair of detector contacts is arranged from the first peripheral edge by a first distance. Similarly, a first detector contact of the second pair of detector contacts is arranged from the second peripheral edge by a second distance. The first detector contact of the first pair of detector contacts and the first detector contact of the second pair of detector contacts may be C7 and C5, respectively. Thus, the first detector contact of the first pair of detector contacts and the first detector contact of the second pair of detector contacts are aligned with each other in the main sensitivity direction of the vertical Hall sensor element. In this case, they are aligned in the x-direction.

Based on this arrangement, the first resistance R67 and the second resistance R65 are equal on a condition that the first distance and the second distance are equal, the first resistance R67 is greater than the second resistance R65 on a condition that the first distance is less than the second distance, and the first resistance R67 is less than the second resistance R65 on a condition that the first distance is greater than the second distance.

The sensor cross-talk compensation system 700 further includes a current source IHx that is configured to inject a sensor current into sensor contact S3 such that a Hall voltage can be measured across sensor contacts S2 and S4 via an operational amplifier 402. The operational amplifier 402, which may be a differential amplifier or other differential circuitry, is configured receive a voltage at a first input terminal and a voltage at a second input terminal, and output a sensor signal SigX (Sig1) that represents a potential drop across sensor contacts S2 and S4 that is dependent on Bx.

A current source I0 is connected to a current mirror arrangement 403 having PMOS current mirrors that force currents into two detector contacts C5, C7 of the asymmetry detector 300x. A divider 404 is connected to each force contact C5, C7 in order to detect the resistance R67 between C6, C7 and the resistance R65 between C6, C5, and to measure a ratio RAT1 (R67/R65) therebetween. Thus, the divider 404 is configured to determine RAT1 and output a signal representative thereof.

The sensor cross-talk compensation system 700 further includes a lateral Hall sensor element Hz (i.e., a Hall plate), also referred to as H2, that is configured to measure Bz magnetic fields. A current source IHz is configured to inject a sensor current into the sensor element Hz and a potential difference across the device, perpendicular to the current flow, is measured by an operational amplifier 405. The operational amplifier 405, which may be a differential amplifier or other differential circuitry, is configured receive a voltage at a first input terminal and a voltage at a second input terminal, and output a sensor signal SigZ (Sig2) that represents a potential difference across the Hall plate that is dependent on Bz.

With sensor signals SigX and SigZ known, along with ratio RAT1 derived from the asymmetry detector 300x, the sensor signal SigX can be compensated in order to counteract any magnetic cross-talk caused by a cross-sensitivity of sensor element Hx to Bz due to an x-shift/asymmetry.

Accordingly, a cross-talk compensation circuit includes a multiplier 406 that is configured to multiply SigX with the inverse of Sxx (S11) to derive a value SigX/Sxx.

The cross-talk compensation circuit further includes an adder 407 that adds −1 to RAT1 to derive a value (RAT1−1). Further downstream, a multiplier 408 is provided that multiplies (RAT1−1) with CX1. Further downstream, a multiplier 409 is provided that multiplies the output of multiplier 408 with the sensor signal SigZ. Further downstream, a multiplier 410 is provided that multiplies the output of multiplier 409 with the negative inverse of Szz (S22). Lastly, the outputs of multipliers 406 and 410 are combined by adder 411 to generate a compensated measurement signal SigOUT1 that is representative of the magnetic field component Bx, where SigOUT1=Sig1/S11+CX1*(1−RAT1)*Sig2/S22.

It will be appreciated that analog components may be exchanged with equivalent circuitry. For example, an adder that adds −1 may be replaced with a subtractor that subtracts 1, or a multiplier may be replaced with a divider that achieves the same mathematical equivalent at the corresponding output. Similarly, the same logic can be extended to equivalent computer codes and equivalent digital components.

It will further be appreciated that sensor chips 401 and 501 may be combined into a single sensor chip that includes asymmetry detectors 200x and 200y, as well as sensor elements Hx and Hy, formed in a single substrate 1. The respective cross-talk compensation circuits may combined in a way that sensor element Hz is shared such that sensor signal SigZ is provided to both respective cross-talk compensation circuits.

The doped well regions 11 and 20 are formed in a same processing step. Also, the contacts of the asymmetry detector 200x and the vertical Hall sensor element Hx are formed in a same processing step. Similarly, the contacts of the asymmetry detector 200y and the vertical Hall sensor element Hx are formed in a same processing step. If combined into a single sensor chip, each of the doped well regions 11 and 20 are formed in a same processing step. Also, the contacts of the asymmetry detectors 200x, 200y and the vertical Hall sensor element Hx, Hy are formed in a same processing step.

A same processing step may be a same doping step during which the substrate 1 is irradiated with dopants of a same conductivity type having a same doping concentration in different regions using a single mask. Thus, a different mask may be used for each processing step. Both doped well regions 11 and 20 are manufactured identically in the very same microelectronic processing steps, with the same masks and with the same implanters or doping procedures. Similarly, the contacts of the asymmetry detectors 200x, 200y and the vertical Hall sensor elements Hx, Hy are manufactured identically in the very same microelectronic processing steps, with the same masks and with the same implanters or doping procedures. As a result, the doped well regions 11 and 20 have a first identical doping concentration profile, and the detector contacts C1-C4 and the sensor contacts S1-S5 have a second identical doping concentration profile.

Similarly, will further be appreciated that sensor chips 601 and 701 may be combined into a single sensor chip that includes asymmetry detectors 300x and 300y, as well as sensor elements Hx and Hy, formed in a single substrate 1. The respective cross-talk compensation circuits may combined in a way that sensor element Hz is shared such that sensor signal SigZ is provided to both respective cross-talk compensation circuits.

The doped well regions 11 and 30 are formed in a same processing step. Also, the contacts of the asymmetry detector 300x and the vertical Hall sensor element Hx are formed in a same processing step. Similarly, the contacts of the asymmetry detector 300y and the vertical Hall sensor element Hy are formed in a same processing step. If combined into a single sensor chip, each of the doped well regions 11 and 30 are formed in a same processing step. Also, the contacts of the asymmetry detectors 300x, 300y and the vertical Hall sensor element Hx are formed in a same processing step.

A same processing step may be a same doping step during which the substrate 1 is irradiated with dopants of a same conductivity type having a same doping concentration in different regions using a single mask. Thus, a different mask may be used for each processing step. Both doped well regions 11 and 30 are manufactured identically in the very same microelectronic processing steps, with the same masks and with the same implanters or doping procedures. Similarly, the contacts of the asymmetry detectors 300x, 300y and the vertical Hall sensor elements Hx, Hy are manufactured identically in the very same microelectronic processing steps, with the same masks and with the same implanters or doping procedures. As a result, the doped well regions 11 and 30 have a first identical doping concentration profile, and the detector contacts C5-C7 and the sensor contacts S1-S5 have a second identical doping concentration profile.

Figure 8:
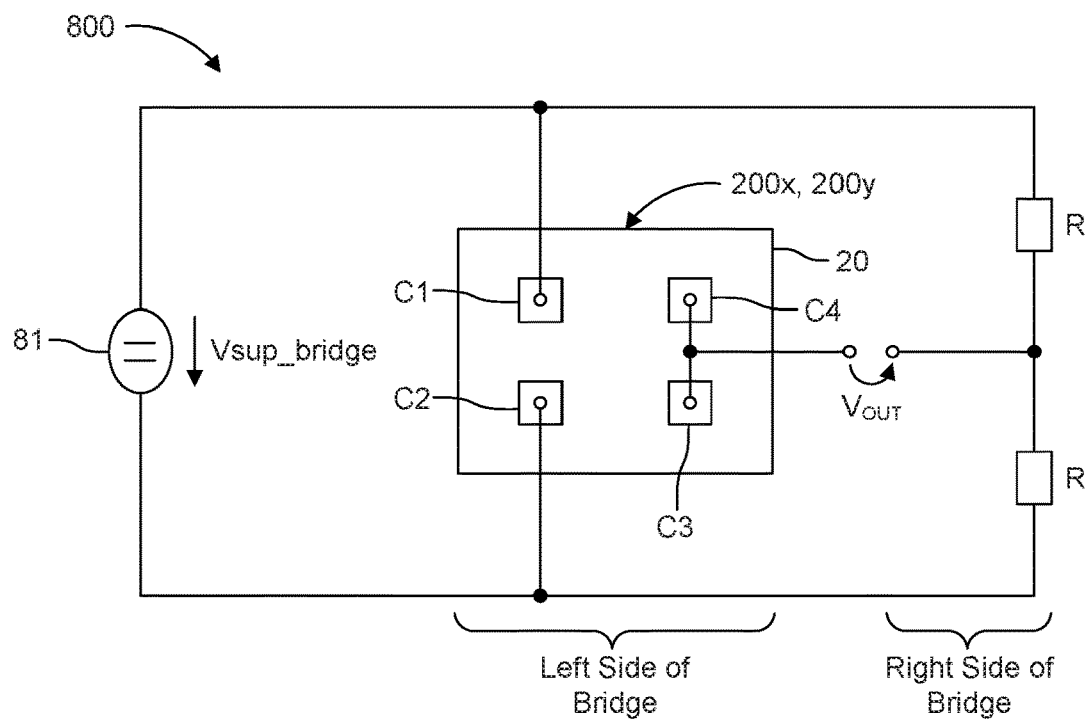
FIG. 8 illustrates a Wheatstone bridge asymmetry detector according to one or more embodiments.

FIG. 8 illustrates a Wheatstone bridge asymmetry detector 800 according to one or more embodiments. In particular, the Wheatstone bridge asymmetry detector 800 may be used instead of asymmetry detector 200x or 200y, where its bridge output Vout (i.e., Vout_bridge) is supplied to the divider 404 or 504, respectively. In particular, the ratio of resistances may be measured directly without measuring the resistances individually. For example, if both resistances are connected in series and considered to be a left side of a Wheatstone bridge, and ordinary (i.e., non-magnetic-sensitive resistors) identical resistors R are used as a right side of the bridge, then the bridge output may be measured by supplying the bridge with a voltage and measuring the bridge output Vout. Thus, the current mirror arrangement 403 or 503 is no longer needed.

The Wheatstone bridge asymmetry detector 800 includes a voltage supply 81 that supplies a voltage Vsup_bridge to the Wheatstone bridge. The Wheatstone bridge includes a left side, including the asymmetry detector 200x or 200y (depending on orientation), and a right side, including two ordinary, identical resistors R. The divider 404 or 504 determines the ratio RAT1 or RAT2 as (Vsup_bridge−2*Vout_bridge)/(Vsup_bridge+2*Vout_bridge). Thus, dividers 404 and 504 are ratio measurement circuits configured to determine a ratio between the first resistance and the second resistance. That is, they implicitly measure the ratio of resistances without having to directly measure the individual resistances.

In the case that the detector contacts C1-C4 have a square shape, as opposed to an elongated shape, the ratio R12/R34 would respond to x-displacement. However, the ratio R14/R24 would respond to y-displacement and may thus also be measured to compensate for a y-displacement. The asymmetry detector is configured to measure the ratio of resistances Rab/Rcd, where the centers of contacts a,b are aligned in the second direction and also contacts c,d are aligned in the second direction. Contacts a_b are not aligned with contacts c,d in the second direction, but instead the contact pairs instead run parallel to each other.

Here, the plurality of sensor contacts S1-S5 are linearly arranged with respect to each other along the first direction, and the first direction is orthogonal to the second direction that defines a main sensitivity direction of the vertical Hall sensor element. Thus, in FIG. 4, the second direction is the x-direction Ra is C1, Rb is C4, Rc is C2, Rd is C3, Rab is R14 (i.e., the resistance between C1 and C4), and Rcd is R23 (i.e., the resistance between C2 and C3). In FIG. 5, the second direction is the y-direction Ra is C1, Rb is C4, Rc is C2, Rd is C3, Rab is R14, and Rcd is R23.

Thus, with an asymmetry detector similar to that shown in FIG. 2 but having 90° symmetry of its well and its contacts, a compensation system may measure both x- and y-shifts in the sensor/detector contacts.

Figure 9:
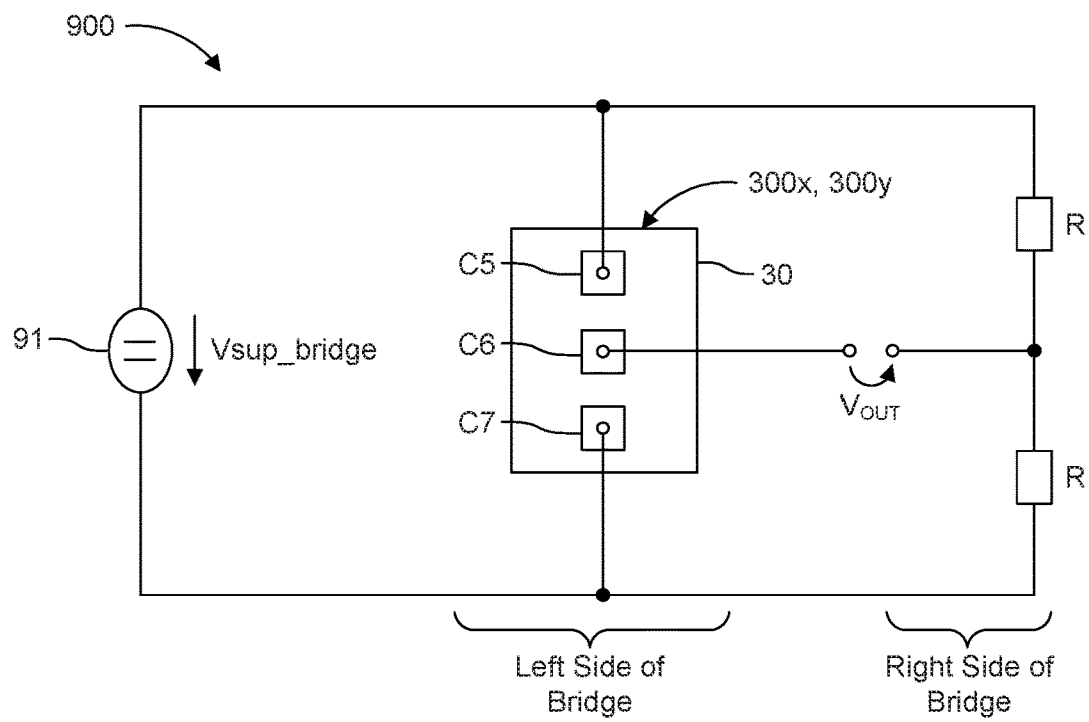
FIG. 9 illustrates another Wheatstone bridge asymmetry detector according to one or more embodiments.

FIG. 9 illustrates another Wheatstone bridge asymmetry detector 900 according to one or more embodiments. In particular, the Wheatstone bridge asymmetry detector 900 may be used instead of asymmetry detector 300x or 300y, where its bridge output Vout is supplied to the divider 404 or 504, respectively. In particular, the ratio of resistances may be measured directly without measuring the resistances individually. For example, if both resistances are connected in series and considered to be a left side of a Wheatstone bridge, and ordinary (i.e., non-magnetic-sensitive resistors) identical resistors R are used as a right side of the bridge, then the bridge output may be measured by supplying the bridge with a voltage and measuring the bridge output. Thus, the current mirror arrangement 403 or 503 is no longer needed.

The Wheatstone bridge asymmetry detector 900 includes a voltage supply 91 that supplies a voltage Vsup_bridge to the Wheatstone bridge. The Wheatstone bridge includes a left side, including the asymmetry detector 300x or 300y (depending on orientation), and a right side, including two ordinary, identical resistors R. The divider 404 or 504 determines the ratio RAT1 or RAT2 as (Vsup_bridge−2*Vout_bridge)/(Vsup_bridge+2*Vout_bridge). Thus, dividers 404 and 504 are ratio measurement circuits configured to determine a ratio between the first resistance and the second resistance. That is, they implicitly measure the ratio of resistances without having to directly measure the individual resistances.

Figure 10A:
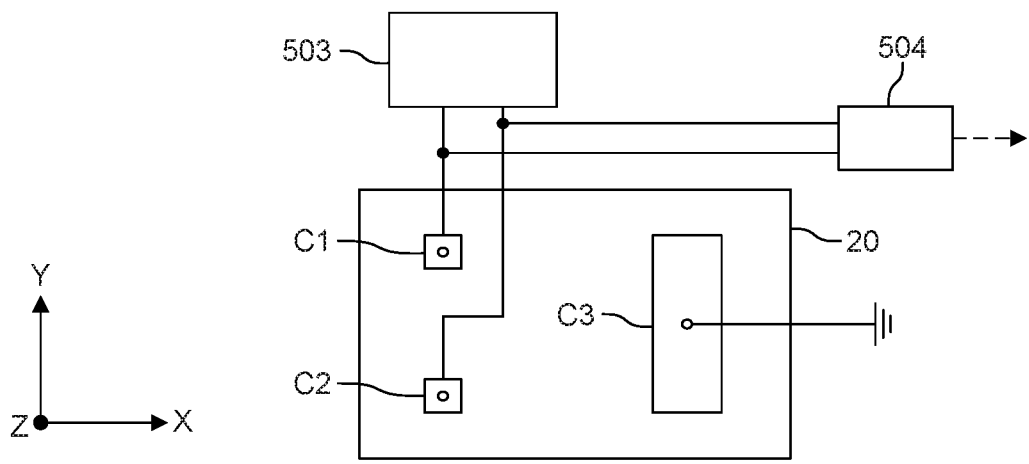
FIGS. 10A-10C illustrate schematic diagrams of additional arrangements for asymmetry detectors implemented in a sensor cross-talk compensation system according to one or more embodiments.
Figure 10B:
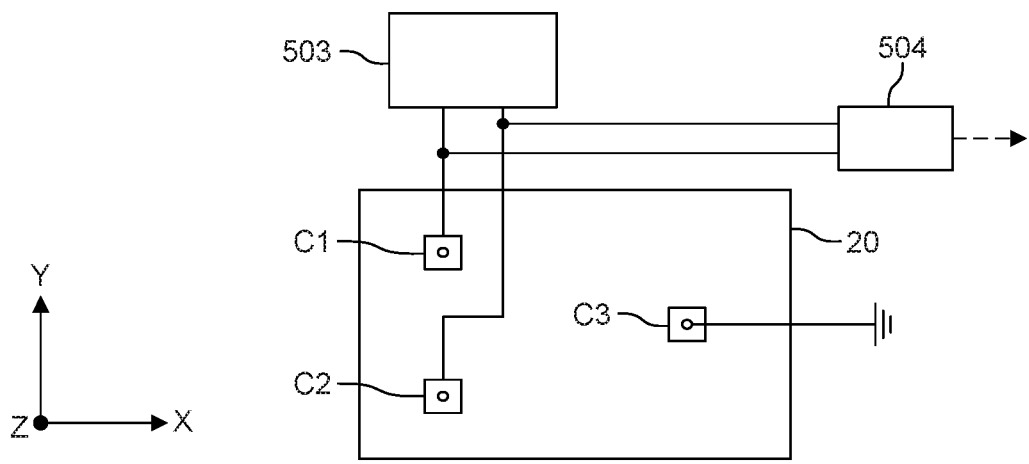
Figure 10C:
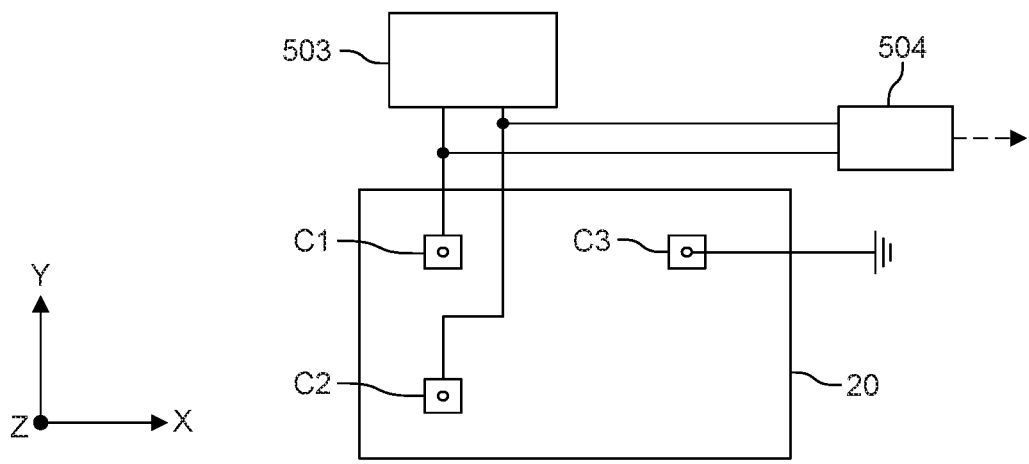

FIGS. 10A-10C illustrate schematic diagrams of additional arrangements for asymmetry detectors implemented in a sensor cross-talk compensation system according to one or more embodiments. In particular, three detector contacts C1-C3 may be used for detecting a positional shift, in this example, in the y-direction. It will be appreciated that the arrangement may also be used to detect a positional shift in the x-direction by rotating the asymmetry detector by 90° (e.g., counterclockwise).

In these examples, detector contacts C1 and C2 are coupled to a current mirror 503 and the resistance between C1 and C3 (i.e., R13) and the resistance between C2 and C3 (i.e., R23) are measured by the divider 504, which outputs a ratio thereof (i.e., RAT2). When R13 is greater than R23, the ratio indicates a shift upwards in the y-direction. When R23 is greater than R13, the ratio indicates a shift downwards in the y-direction.

A method of manufacturing a sensor chip is provided. The method includes providing a semiconductor substrate and having a first main surface and a second main surface opposite to the first main surface; forming a sensor main region of a vertical Hall sensor element in the semiconductor substrate, wherein the sensor main region vertically extends into the semiconductor substrate from the first main surface towards the second main surface and is of a conductivity type, and wherein the vertical Hall sensor element is configured to generate a first sensor signal in response to a first magnetic field impinging thereon from a first direction; forming a plurality of sensor contacts in the sensor main region, wherein the plurality of sensor contacts are of the conductivity type; forming a detector main region of an asymmetry detector in the semiconductor substrate, wherein the detector main region vertically extends into the semiconductor substrate from the first main surface towards the second main surface and is of the conductivity type having a first doping concentration, and wherein the asymmetry detector is configured to detect an asymmetric characteristic of the vertical Hall sensor element; and forming at least three detector contacts in the detector main region, wherein the at least three detector contacts are ohmic contacts of the conductivity type having a second doping concentration that is higher than the first doping concentration.

The detector main region includes a first peripheral edge and a second peripheral edge oppositely arranged from the first peripheral edge in the first direction, A first pair of detector contacts of the at least three detector contacts have a first resistance therebetween. A second pair of detector contacts of the at least three detector contacts have a second resistance therebetween. A first detector contact of the first pair of detector contacts is arranged from the first peripheral edge by a first distance, and a first detector contact of the second pair of detector contacts is arranged from the second peripheral edge by a second distance. The first resistance and the second resistance are equal on a condition that the first distance and the second distance are equal, the first resistance is greater than the second resistance on a condition that the first distance is less than the second distance, and the first resistance is less than the second resistance on a condition that the first distance is greater than the second distance.

The method of manufacturing the sensor chip is further defined by such that forming the sensor main region and forming the detector main region includes applying a first mask to the first main surface of the semiconductor substrate and forming the sensor main region and the detector main region in a same first doping processing step; and forming the plurality of sensor contacts and forming the at least three detector contacts includes applying a second mask to the first main surface of the semiconductor substrate and forming the plurality of sensor contacts and the at least three detector contacts in a same second doping processing step. As a result, the sensor main region and the detector main region have a first identical doping concentration profile, and the plurality of sensor contacts and the at least three detector contacts have a second identical doping concentration profile. Furthermore, the sensor main region, the detector main region, the plurality of sensor contacts, and the at least three detector contacts all have the same conductivity type (e.g., an n-doping or a p-doping) and may be formed by introducing the dopant into the substrate, for example, by diffusion or any other implantation technique.

The sensor and detector contacts may be formed on top of the first main surface of the semiconductor substrate, with or without extending into the semiconductor substrate, or may be confined within the semiconductor substrate, and thus, vertically extend into the semiconductor substrate from the first main surface.

The at least three detector contacts may have a first elongated shape defining a first longitudinal axis that extends along the first main surface in a second direction orthogonal to the first direction, and wherein the first longitudinal axes of the at least three detector contacts are parallel to each other.

One or more embodiments further provide a sensor chip manufactured by the method of manufacturing.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A sensor cross-talk compensation system, comprising:
a semiconductor substrate having a first main surface and a second main surface opposite to the first main surface;
a vertical Hall sensor element disposed in the semiconductor substrate, wherein the vertical Hall sensor element is configured to generate a first sensor signal in response to a first magnetic field impinging thereon;
an asymmetry detector configured to detect an asymmetric characteristic of the vertical Hall sensor element, wherein the asymmetry detector comprises:

a detector main region that vertically extends into the semiconductor substrate from the first main surface towards the second main surface and is of a first conductivity type having a first doping concentration; and at least three detector contacts disposed in the detector main region at the first main surface, wherein the at least three detector contacts are ohmic contacts of a second conductivity type having a second doping concentration that is higher than the first doping concentration, wherein the first conductivity type and the second conductivity type are the same conductivity type; and a cross-talk compensation circuit comprising:

a resistance ratio measurement circuit configured to determine a ratio between a first resistance and a second resistance, wherein the first resistance is a resistance between a first pair of detector contacts of the at least three detector contacts and the second resistance is a resistance between a second pair of detector contacts of the at least three detector contacts; and signal processing circuitry configured to generate a compensated measurement signal based on the first sensor signal and the determined ratio.

2. The sensor cross-talk compensation system of claim 1, wherein the vertical Hall sensor element comprises:

a sensor main region that vertically extends into the semiconductor substrate from the first main surface towards the second main surface and is a third conductivity type; and a plurality of sensor contacts disposed in the sensor main region, wherein the plurality of sensor contacts vertically extend into the semiconductor substrate from the first main surface towards the second main surface and are a fourth conductivity type.

3. The sensor cross-talk compensation system of claim 2, wherein:

each of the at least three detector contacts have a first elongated shape defining a first longitudinal axis that extends parallel to the first main surface in a first direction, and wherein the first longitudinal axes of the at least three detector contacts are parallel to each other, and the plurality of sensor contacts are linearly arranged with respect to each other along the first direction, wherein the first direction is orthogonal to a second direction that defines a main sensitivity direction of the vertical Hall sensor element.

4. The sensor cross-talk compensation system of claim 3, wherein the vertical Hall sensor element is configured to generate the first sensor signal in response to the first magnetic field aligned in the second direction.

5. The sensor cross-talk compensation system of claim 3, wherein the plurality of sensor contacts have a second elongated shape defining a second longitudinal axis that extends along the first main surface in the second direction, wherein the second longitudinal axes of the plurality of sensor contacts are parallel to each other, and wherein the first elongated shape is the same as the second elongated shape.

6. The sensor cross-talk compensation system of claim 2, wherein the detector main region and the sensor main region have a same size.

7. The sensor cross-talk compensation system of claim 2, wherein:

the sensor main region and the detector main region have a first identical doping concentration profile, and the at least three detector contacts and the plurality of sensor contacts have a second identical doping concentration profile.

8. The sensor cross-talk compensation system of claim 1, wherein the cross-talk compensation circuit further comprises:

a lateral Hall sensor element configured to generate a second sensor signal in response to a second magnetic field impinging thereon, wherein the signal processing circuitry is configured to generate the compensated measurement signal based on the first sensor signal, the determined ratio, and the second sensor signal.

9. The sensor cross-talk compensation system of claim 8, wherein the compensated measurement signal represents a field strength of the first magnetic field.

10. The sensor cross-talk compensation system of claim 8, wherein:

the vertical Hall sensor element is configured to generate the first sensor signal in response to the first magnetic field that is aligned in a second direction that is orthogonal and in-plane to a first direction, wherein the first direction is a direction of extension of a first longitudinal axis of each of the at least three detector contacts, and the lateral Hall sensor element is configured to generate the second sensor signal in response to the second magnetic field aligned that is aligned in a third direction that is orthogonal and out-of-plane to the first direction and the second direction.

11. The sensor cross-talk compensation system of claim 10, wherein the vertical Hall sensor element has a main sensitivity direction aligned with the second direction and a cross-sensitivity direction aligned with the third direction.

12. The sensor cross-talk compensation system of claim 8, wherein the signal processing circuitry is configured combine the second sensor signal with the determined ratio to generate a compensation signal, and is further configured to combine the compensation signal with the first sensor signal to generate the compensated measurement signal.

13. The sensor cross-talk compensation system of claim 1, wherein:

the detector main region includes a first peripheral edge and a second peripheral edge oppositely arranged from the first peripheral edge in a main sensitivity direction of the vertical Hall sensor element, a first detector contact of the first pair of detector contacts is arranged from the first peripheral edge by a first distance, a first detector contact of the second pair of detector contacts is arranged from the second peripheral edge by a second distance, the first resistance and the second resistance are equal on a condition that the first distance and the second distance are equal, the first resistance is greater than the second resistance on a condition that the first distance is less than the second distance, and the first resistance is less than the second resistance on a condition that the first distance is greater than the second distance.

14. The sensor cross-talk compensation system of claim 13, wherein the first detector contact of the first pair of detector contacts and the first detector contact of the second pair of detector contacts are aligned with each other in the main sensitivity direction of the vertical Hall sensor element.

15. A method of performing sensor cross-talk compensation, the method comprising:
- generating a first sensor signal by a vertical Hall sensor element responsive to a first magnetic field aligned in a first direction, the first direction being in-plane to a main surface of a substrate comprising the vertical Hall sensor element;
- generating a second sensor signal by a lateral Hall sensor element responsive to a second magnetic field aligned in a second direction orthogonal to the first direction and out-of-plane to the main surface of the substrate;
- determining a ratio between a first resistance and a second resistance, wherein the first resistance is a resistance between a first pair of detector contacts of an asymmetry detector and the second resistance is a resistance between a second pair of detector contacts of the asymmetry detector, wherein at least one contact of the second pair of detector contacts is different from the first pair of detector contacts; and
- generating a compensated measurement signal based on the first sensor signal, the second sensor signal, and the determined ratio.

16. The method of claim 15, wherein the compensated measurement signal represents a field strength of the first magnetic field.

17. The method of claim 15, wherein generating the compensated measurement signal comprises:
- combining the second sensor signal with the determined ratio to generate a compensation signal; and
- combining the compensation signal with the first sensor signal to generate the compensated measurement signal.

18. The method of claim 15, wherein:
measuring the first resistance and measuring the second resistance comprise:
- supplying the first pair of detector contacts and the second pair of detector contacts with electrical energy and measuring a resulting current flow through a respective portion of the asymmetry detector or a resulting voltage drop across the respective portion of the asymmetry detector.

19. The method of claim 15, wherein the first pair of detector contacts and the second pair of detector contacts have longitudinal axes aligned in a second direction being orthogonal to the first direction and in-plane to the main surface of the substrate, and wherein the longitudinal axes of the first pair of detector contacts and the second pair of detector contacts are parallel to each other.

20. The sensor cross-talk compensation system of claim 2, wherein the third conductivity type and the fourth conductivity type are the same conductivity type.

21. The sensor cross-talk compensation system of claim 2, wherein the first conductivity type, the second conductivity type, the third conductivity type, and the fourth conductivity type are the same conductivity type.

* * * * *